(12) United States Patent
Cheng et al.

(10) Patent No.: US 12,406,850 B2
(45) Date of Patent: Sep. 2, 2025

(54) SEMICONDUCTOR STRUCTURE HAVING METAL CONTACT FEATURES

(71) Applicant: Taiwan Semiconductor Manufacturing Company, Ltd., Hsinchu (TW)

(72) Inventors: Chung-Liang Cheng, Changhua County (TW); Ziwei Fang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 21 days.

(21) Appl. No.: 17/962,276

(22) Filed: Oct. 7, 2022

(65) Prior Publication Data

US 2023/0037334 A1    Feb. 9, 2023

Related U.S. Application Data

(62) Division of application No. 16/353,531, filed on Mar. 14, 2019, now Pat. No. 11,469,109.

(51) Int. Cl.
| | |
|---|---|
| *H01L 21/28* | (2025.01) |
| *H01L 21/02* | (2006.01) |
| *H01L 21/285* | (2006.01) |
| *H10D 30/01* | (2025.01) |
| *H10D 30/62* | (2025.01) |
| *H10D 30/69* | (2025.01) |
| *H10D 62/00* | (2025.01) |
| *H10D 62/13* | (2025.01) |
| *H10D 64/62* | (2025.01) |

(52) U.S. Cl.
CPC .. *H01L 21/28518* (2013.01); *H01L 21/02063* (2013.01); *H01L 21/02244* (2013.01); *H10D 30/024* (2025.01); *H10D 30/6211* (2025.01); *H10D 30/797* (2025.01); *H10D 62/021* (2025.01); *H10D 62/151* (2025.01); *H10D 64/62* (2025.01)

(58) Field of Classification Search
CPC ......... H01L 21/28518; H01L 21/02063; H01L 21/02244; H01L 29/0847; H01L 29/45; H01L 29/66636; H01L 29/66795; H01L 29/7848; H01L 29/7851
USPC ....................................................... 257/384
See application file for complete search history.

(56) References Cited

U.S. PATENT DOCUMENTS

| | | |
|---|---|---|
| 6,395,192 B1 | 5/2002 | Nemirovsky et al. |
| 8,772,109 B2 | 7/2014 | Colinge |

(Continued)

*Primary Examiner* — Ori Nadav
(74) *Attorney, Agent, or Firm* — Birch, Stewart, Kolasch & Birch, LLP

(57) ABSTRACT

A semiconductor structure is provided. The semiconductor structure includes an epitaxial structure over a semiconductor substrate. The semiconductor structure also includes a conductive feature over the semiconductor substrate. The conductive feature includes a high-k dielectric layer and a metal layer on the high-k dielectric layer, and a top surface of the metal layer is below a top surface of the high-k dielectric layer. The semiconductor structure further includes a metal-semiconductor compound layer formed on the epitaxial structure. In addition, the semiconductor structure includes a first metal contact structure formed on the top surface of the metal layer of the conductive feature. The semiconductor structure further includes a second metal contact structure formed on the metal-semiconductor compound layer.

20 Claims, 19 Drawing Sheets

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 2004/0213916 A1 | 10/2004 | Carey, II et al. |
| 2012/0211837 A1 | 8/2012 | Baars et al. |
| 2016/0276369 A1 | 9/2016 | Cao et al. |

SEMICONDUCTOR STRUCTURE HAVING METAL CONTACT FEATURES

CROSS REFERENCE TO RELATED APPLICATIONS

This application is a Division of pending U.S. patent application Ser. No. 16/353,531, filed Mar. 14, 2019 and entitled "SEMICONDUCTOR STRUCTURE HAVING METAL CONTACT FEATURES AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
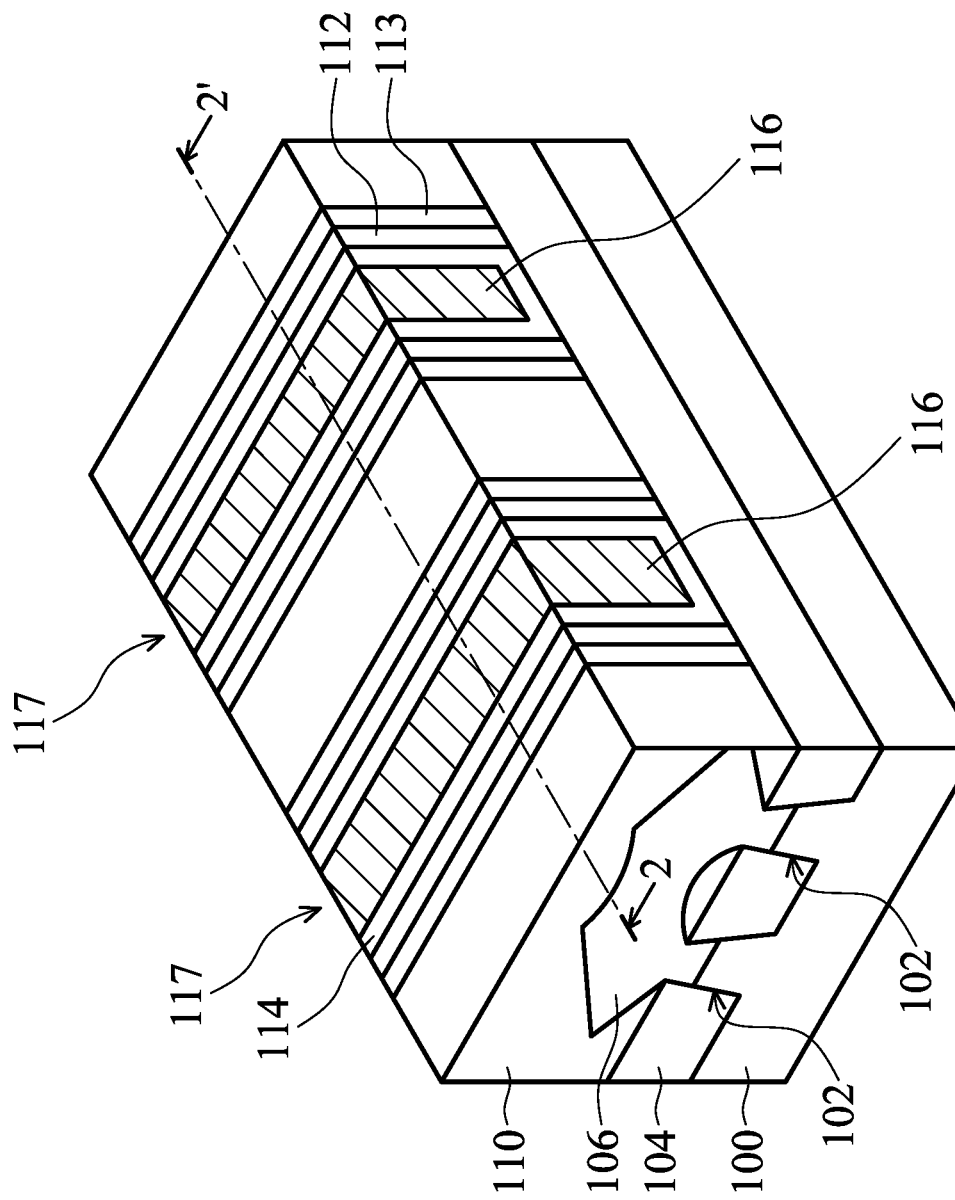
FIGS. 1A-1I are perspective views of various stages of a process for forming a semiconductor structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments of the disclosure may relate to a FinFET structure having fins. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments for forming a semiconductor structure are provided. The method for forming the semiconductor structure may include transforming a portion of a metal-containing layer over a conductive feature into a metal-semiconductor compound layer, and oxidizing another portion of the metal-containing layer into a metal oxide layer. The metal oxide layer may be removed by using a metal chloride-containing etching gas. In addition, a metal contact feature may be selectively grown on the metal-semiconductor compound layer. Moreover, a metal-containing element that is substantially fluorine free may be selectively grown on the metal-semiconductor compound layer. The selective growths of the metal-containing element and the metal contact feature may be in-situ performed, thus the electrical connection between the metal contact feature and the conductive feature can be greatly improved.

FIGS. 1A-1I are perspective views of various stages of a process for forming a semiconductor structure 100, in accordance with some embodiments of the disclosure. FIGS. 2A-2I are cross-sectional views of various stages of the process for forming the semiconductor structure 100 as shown in FIGS. 1A-1T, in accordance with some embodiments of the disclosure. FIGS. 2A-2I are cross-sectional representations taken along cross-sectional lines 2-2' of FIGS. 1A-1I, in accordance with some embodiments of the disclosure.

Figure 2A:
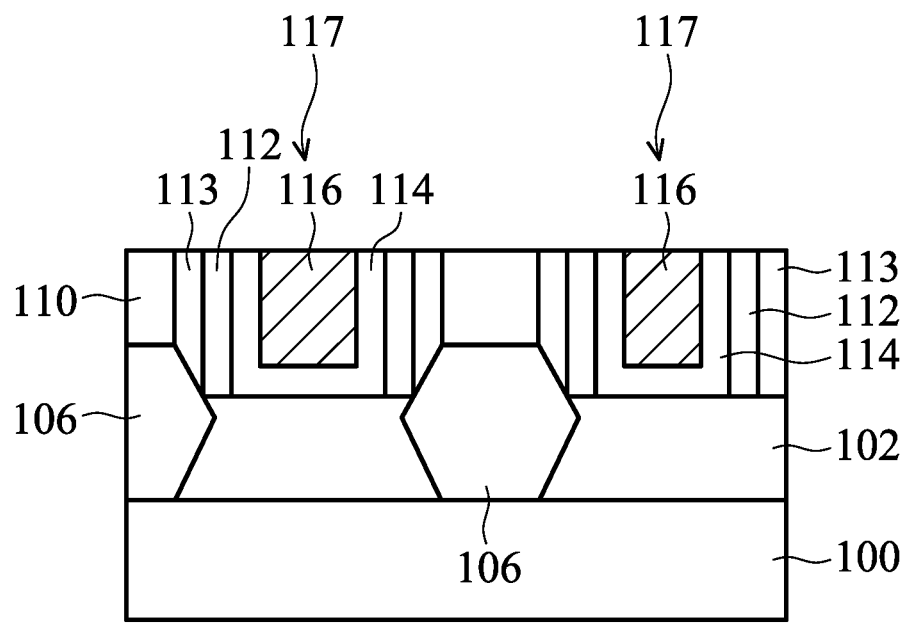
FIGS. 2A-2I are cross-sectional views of various stages of the process for forming the semiconductor structure as shown in FIGS. 1A-1I, in accordance with some embodiments of the disclosure.

A semiconductor substrate 100 is provided as shown in FIGS. 1A and 2A, in accordance with some embodiments of the disclosure. In some embodiments, the semiconductor substrate 100 is a bulk semiconductor substrate, such as a semiconductor wafer. For example, the semiconductor substrate 100 includes silicon or other elementary semiconductor materials such as germanium. In some embodiments, the semiconductor substrate 100 may be un-doped or doped (e.g., p-type, n-type, or a combination thereof).

In some other embodiments, the semiconductor substrate 100 includes a compound semiconductor. The compound semiconductor may include silicon carbide, gallium arsenide, indium arsenide, indium phosphide, one or more other applicable compound semiconductors, or a combination thereof.

In some embodiments, the semiconductor substrate 100 is an active layer of a semiconductor-on-insulator (SOI) substrate. The SOI substrate may be fabricated using a separation by implantation of oxygen (SIMOX) process, a wafer bonding process, another applicable method, or a combination thereof. In some embodiments, the semiconductor substrate 100 includes a multi-layered structure. For example, the semiconductor substrate 100 includes a silicon-germanium layer formed on a bulk silicon layer.

Recesses (or trenches) are formed in the semiconductor substrate 100 as shown in FIG. 1A, in accordance with some embodiments. As a result, fin structures are formed or defined between the recesses. Two of the fin structures (the fin structure 102) are shown in FIG. 1A, and one of the fin structures is shown in FIG. 2A, in accordance with some embodiments. In some embodiments, one or more photolithography and etching processes are used to form the recesses. In some embodiments, the fin structures 102 are in direct contact with the semiconductor substrate 100.

However, embodiments of the disclosure have many variations and/or modifications. In some other embodiments, the fin structures 102 are not in direct contact with the semiconductor substrate 100. One or more other material layers may be formed between the semiconductor substrate 100 and the fin structures 102. For example, a dielectric layer may be formed between the semiconductor substrate 100 and the fin structures 102.

An isolation feature 104 is formed in the recesses to surround lower portions of the fin structures 102 as shown in FIG. 1A, in accordance with some embodiments. The isolation feature 104 may be used to define and electrically isolate various device elements formed in and/or over the semiconductor substrate 100. In some embodiments, the isolation feature 104 includes shallow trench isolation (STI) features, local oxidation of silicon (LOCOS) features, another applicable isolation feature, or a combination thereof.

In some embodiments, the isolation feature 104 has a multi-layer structure. In some embodiments, the isolation feature 104 is made of a dielectric material. The dielectric material may include silicon oxide, silicon nitride, silicon oxynitride, fluoride-doped silicate glass (FSG), low-K dielectric material, one or more other applicable materials, or a combination thereof. In some embodiments, an STI liner (not shown) is formed to reduce crystalline defects at the interface between the semiconductor substrate 100 and the isolation feature 104. Similarly, the STI liner may also be used to reduce crystalline defects at the interface between the isolation feature 104 and the fin structures 102.

In some embodiments, a dielectric material layer is deposited over the semiconductor substrate 100. The dielectric material layer covers the fin structures 102 and fills the recesses between the fin structures 102. The dielectric material layer may be deposited using a chemical vapor deposition (CVD) process, an atomic layer deposition (ALD) process, a physical vapor deposition (PVD) process, a spin-on process, one or more other applicable processes, or a combination thereof.

In some embodiments, a planarization process is then used to thin down the dielectric material layer until the fin structures 102 or hard mask elements defining the fin structures 102 are exposed. The planarization process may include a chemical mechanical polishing (CMP) process, a grinding process, a dry polishing process, an etching process, one or more other applicable processes, or a combination thereof. Afterwards, the dielectric material layer may be etched back such that the fin structures 102 protrude from the top surface of the remaining dielectric material layer after the etching process. As a result, the remaining portions of the dielectric material layer form the isolation feature 104, as shown in FIG. 1A, in accordance with some embodiments.

Afterwards, dummy gate stacks (not shown) are formed over the semiconductor substrate 100 to partially cover the fin structures 102, in accordance with some embodiments. The dummy gate stacks may include a gate electrode and a gate dielectric layer. In some embodiments, a gate dielectric material layer and a gate electrode material layer are deposited over the isolation feature 104 and the fin structures 102. Afterwards, the gate dielectric material layer and the gate electrode material layer may be patterned to form the dummy gate stacks.

In some embodiments, spacers are formed over sidewalls of the dummy gate stacks. The spacers may be used to assist in the formation of source and drain structures (or regions) in subsequent processes. In some embodiments, each of the spacers includes a first spacer element 112 adjacent to the sidewalls of the corresponding dummy gate stacks and a second spacer element 113 adjacent to the first spacer element 112 as shown in FIGS. 1A and 2A, in accordance with some embodiments. The first spacer element 112 may be used for protecting the dummy gate stacks from damage or loss in subsequent processes. In some embodiments, the first spacer element 112 is made of a low-K material, for example, silicon nitride, silicon oxide, silicon oxynitride, silicon carbide, silicon carbon oxynitride, one or more other applicable materials, or a combination thereof. In some embodiments, the second spacer element 113 is made of a material different from that of the first spacer element 112, and the second spacer element 113 is made of silicon nitride, silicon oxide, silicon oxynitride, silicon carbide, silicon carbon oxynitride, one or more other applicable materials, or a combination thereof.

In some embodiments, a first spacer layer and a second spacer layer are deposited over the semiconductor substrate 100, the fin structures 102, and the dummy gate stacks. The first spacer layer and the second spacer layer may be deposited using a CVD process, an ALD process, a PVD process, a spin-on process, one or more other applicable processes, or a combination thereof. Afterwards, an etching process, such as an anisotropic etching process, may be performed to partially remove the first spacer layer and the second spacer layer. As a result, the remaining portions of the first spacer layer and the second spacer layer over the sidewalls of the dummy gate stacks form the first spacer element 112 and the second spacer element 113, respectively.

Afterwards, the fin structures 102 are partially removed to form recesses, in accordance with some embodiments. In some embodiments, the fin structures 102 are recessed to a level below the top surface of the isolation feature 104. In some embodiments, an etching process is used to form the recesses.

Many variations and/or modifications can be made to embodiments of the disclosure. In some other embodiments, the fin structures 102 are not recessed. The fin structures 102 may be merely thinned without being recessed to a level below the top surface of the isolation feature 104.

Afterwards, one or more semiconductor materials are epitaxially grown over the fin structures 102 to fill the recesses, in accordance with some embodiments. As a result, epitaxial structures (the epitaxial structure 106) are formed over the semiconductor substrate 100 as shown in FIGS. 1A and 2A, in accordance with some embodiments. The epitaxial structure 106 may function as a source or drain structure. The epitaxial structure 106 may also function as a stressor to improve carrier mobility. In some embodiments, a merged epitaxial structure 106 is formed on two fin structures 102 as shown in FIG. 1A. In some other embodiments, isolated epitaxial structures are formed on different individual fin structures 102, respectively (not shown in FIG. 1A).

In some embodiments, the epitaxial structure 106 is formed of a silicon-containing material. In some embodiments, the epitaxial structure 106 is made of one or more p-type semiconductor materials. For example, the epitaxial structure 106 may include epitaxially grown silicon germanium, one or more other applicable epitaxially grown p-type silicon-containing semiconductor materials, or a combination thereof. In some other embodiments, the epitaxial structure 106 is made of one or more n-type semiconductor materials. The epitaxial structure 106 may include epitaxially grown silicon, epitaxially grown silicon carbide (SiC), one or more other applicable epitaxially grown n-type silicon-containing semiconductor materials, or a combination thereof.

In some embodiments, the epitaxial structure 106 is formed using a selective epitaxy growth (SEG) process, a CVD process (e.g., a vapor-phase epitaxy (VPE) process, a low pressure chemical vapor deposition (LPCVD) process, and/or an ultra-high vacuum CVD (UHV-CVD) process), a molecular beam epitaxy process, an ALD process, one or more other applicable processes, or a combination thereof. The formation process of the epitaxial structure 106 may use gaseous and/or liquid precursors.

In some embodiments, the epitaxial structure 106 includes dopants. For example, the epitaxial structure 106 is p-type doped, and the dopants may include boron, gallium, one or more other applicable dopants, or a combination thereof. For example, the epitaxial structure 106 may also be n-type doped, and the dopants may include phosphor. In some embodiments, the epitaxial structure 106 is doped in-situ during the growth of the epitaxial structure 106. In some other embodiments, the epitaxial structure 106 is not doped during the growth of the epitaxial structure 106. In some embodiments, one or more implantation processes are used to dope the epitaxial structure 106. After the epitaxial growth, the epitaxial structure 106 may be doped in a subsequent process.

In some embodiments, the doping is achieved using an ion implantation process, a plasma immersion ion implantation process, a gas and/or solid source diffusion process, one or more other applicable processes, or a combination thereof. In some embodiments, the epitaxial structure 106 is further exposed to one or more annealing processes to activate the dopants. For example, a rapid thermal annealing process is used.

In some embodiments, a dielectric material layer is deposited over the epitaxial structures 106, the isolation feature 104, and the dummy gate stacks. The dielectric material layer may be made of silicon oxide, silicon oxynitride, borosilicate glass (BSG), phosphoric silicate glass (PSG), borophosphosilicate glass (BPSG), fluorinated silicate glass (FSG), low-k material, porous dielectric material, one or more other applicable dielectric materials, or a combination thereof. In some embodiments, the dielectric material layer is deposited using a CVD process, an ALD process, a PVD process, a spin-on process, one or more other applicable processes, or a combination thereof.

Afterwards, the dielectric material layer may be thinned until the dummy gate stacks are exposed. The dielectric material layer may be thinned until the hard mask elements used for defining the dummy gate stacks are exposed. Alternatively, the dielectric material layer may be thinned until the dummy gate stacks are exposed. After the thinning process of the dielectric material layer, the remaining portion of the dielectric material layer forms the dielectric layer 110 over the semiconductor substrate 100 as shown in FIGS. 1A and 2A, accordance with some embodiments. The dielectric layer 110 covers the epitaxial structures 106 and surrounds the dummy gate stacks.

Afterwards, a gate replacement process may be performed. The dummy gate stacks may be removed to form trenches. Then, metal gate stacks 117 may be formed in the trenches. Each of the metal gate stacks 117 may include a high-k gate dielectric layer 114 and a metal layer 116 on the high-k dielectric layer 114. The metal layer 116 may serve as a metal electrode and include a work function layer and a metal filling surrounded by the work function layer. In some embodiments, the dielectric layer 110 serves as an interlayer dielectric (ILD) and surrounds the metal gate stacks 117, and a top surface of the dielectric layer 110 is substantially level with a top surface of the metal layer 116 and a top surface of the high-k dielectric layer 114 as shown in FIGS. 1A and 2A.

Figure 1B:
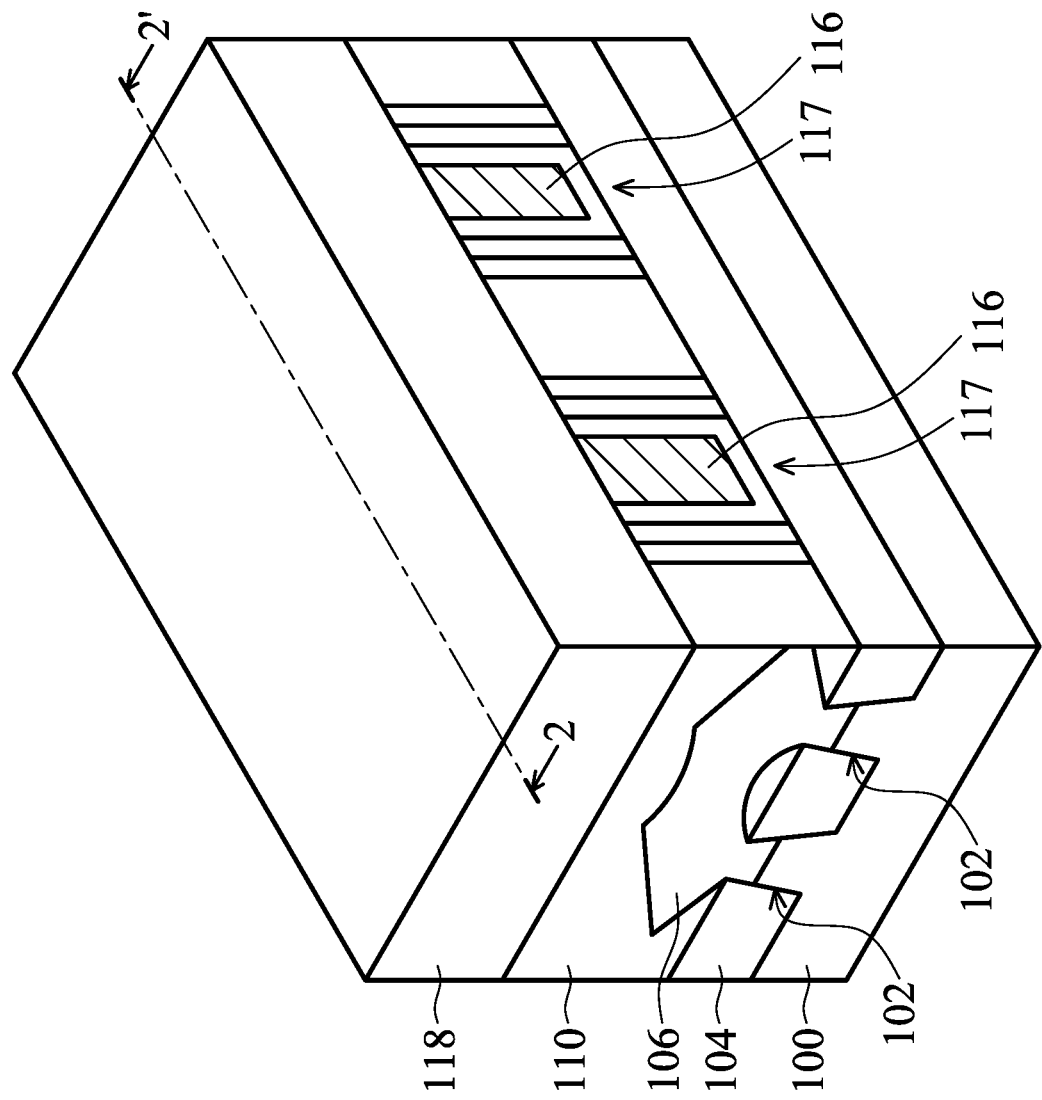
Figure 2B:
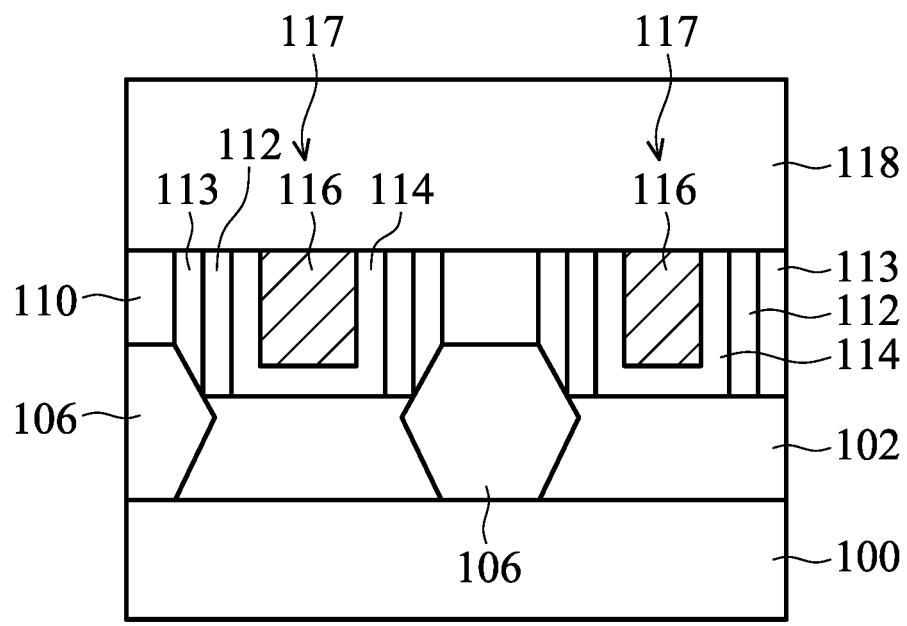

Afterwards, a dielectric layer 118 is deposited over the dielectric layer 110 and the metal gate stacks 117 as shown in FIGS. 1B and 2B, in accordance with some embodiments. In some embodiments, the dielectric layer 118 is formed so as to cover the metal layers 116 and the epitaxial structures 106. The material and the formation method of the dielectric layer 118 may be the same as or similar to those of the dielectric layer 110.

Figure 1C:
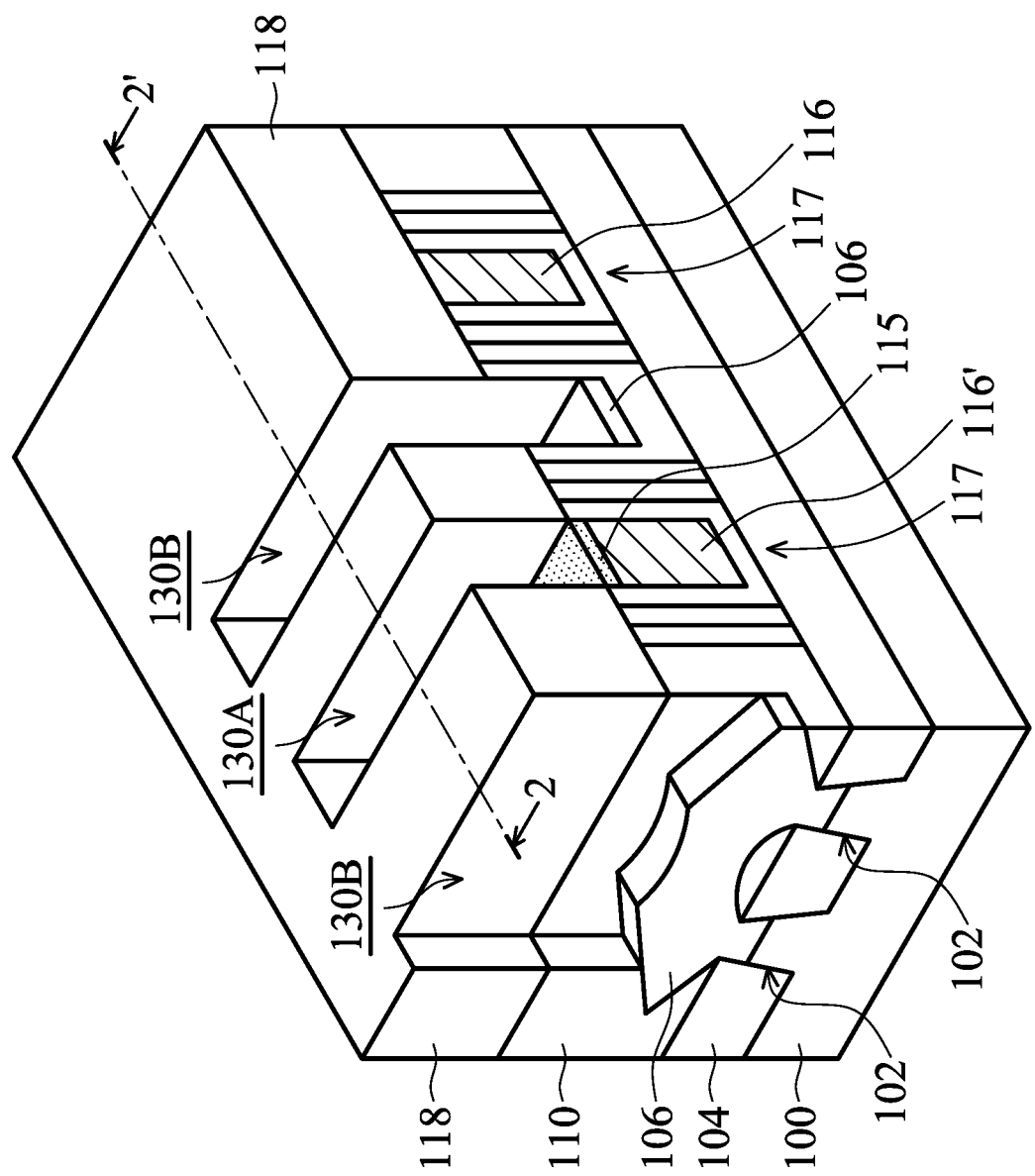
Figure 2C:
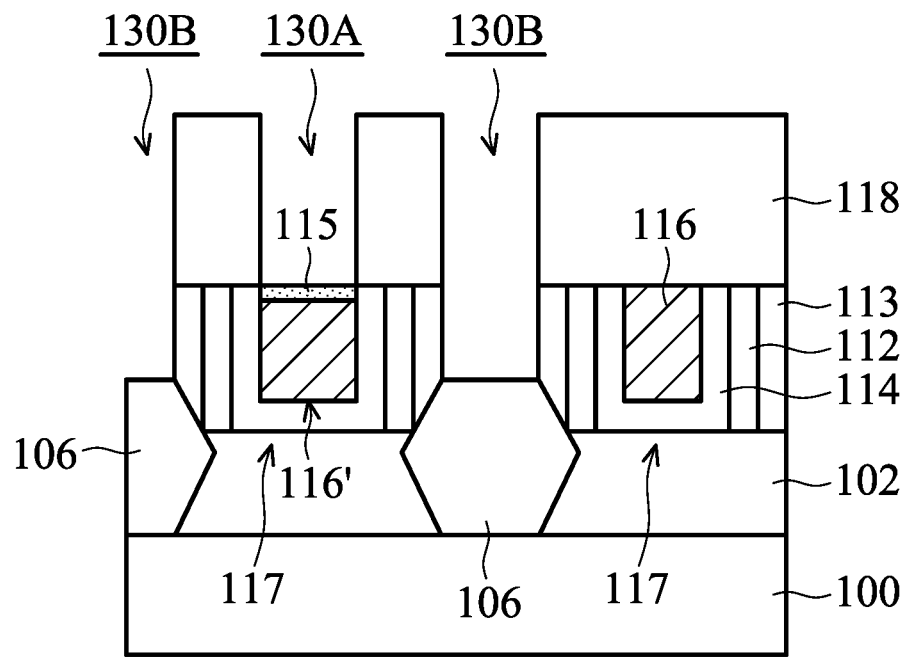

Afterwards, an opening 130A is formed to expose the metal gate stack 117, and openings 130B are formed to expose top surfaces of the epitaxial structures 106, as shown in FIGS. 1C and 2C, in accordance with some embodiments. In some embodiments, the openings 130A and 130B are formed in the dielectric layer 110 and the dielectric layer 118 to respectively expose the metal layer 116 and the epitaxial structures 106 as shown in FIGS. 1C and 2C. The formation of the openings 130A and 130B may involve one or more photolithography processes and one or more etching processes.

In some embodiments, after the metal layer 116 of the metal gate stack 117 is exposed by the opening 130A, the metal layer 116 is slightly oxidized to form a native oxide layer 115 of the metal layer 116' as shown in FIGS. 1C and 2C. In some embodiments, the native oxide layer 115 has a thickness that is in a range from about 1 nm to about 2 nm. In some embodiments, the native oxide layer 115 is made of an oxide of the metal filling and/or the work function layer of the metal layer 116.

Figure 1D:
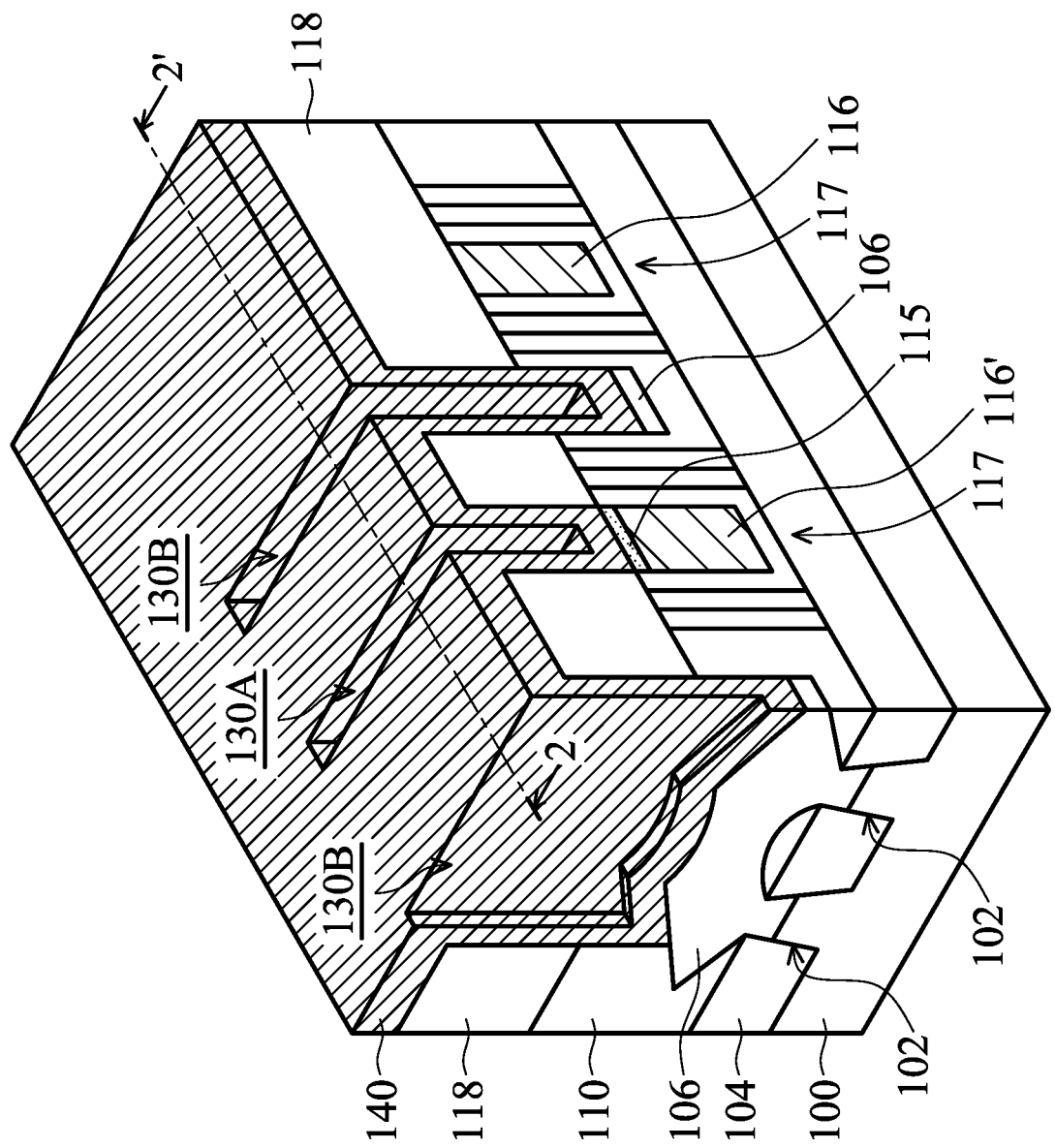
Figure 2D:
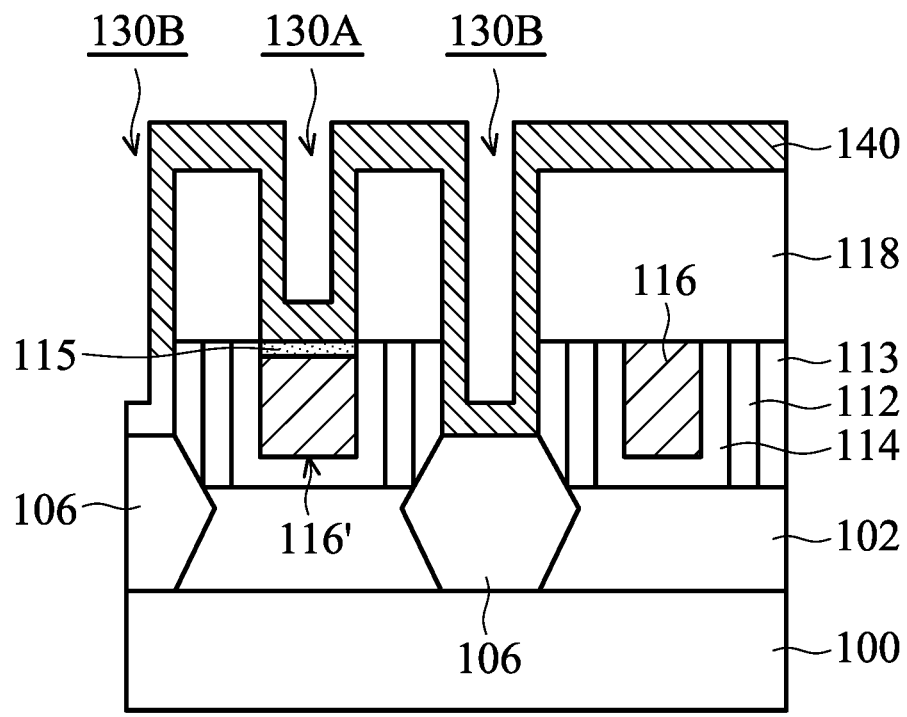

Afterwards, a metal material 140 is deposited over the dielectric layer 118, the top surfaces of the epitaxial structures 106, and the metal layer 116' as shown in FIGS. 1D and 2D, in accordance with some embodiments. In some embodiments, the metal material 140 is deposited directly on sidewalls and bottoms of the openings 130A and 130B as shown in FIGS. 1D and 2D. In some embodiments, the metal material 140 is made of titanium. In some embodiments, the metal material 140 is made of nickel, cobalt, germanium, one or more other applicable metal materials, or a combination thereof. The metal material 140 may be deposited using a CVD process, an ALD process, a PVD process, one or more other applicable processes, or a combination thereof.

In some embodiments, the metal material 140 formed on the dielectric layer 118 and the bottoms of the openings 130A and 130B has a thickness larger than that of the metal material 140 formed on the sidewalls of the openings 130A and 130B. In some embodiments, a ratio of the thickness of the metal material 140 formed on the dielectric layer 118 and the thickness of the metal material 140 formed on the bottoms of the openings 130A and 130B is in a range from about 1 to about 2. In some embodiments, a ratio of the thickness of the metal material 140 formed on the dielectric layer 118 and the thickness of the metal material 140 formed on the sidewalls of the openings 130A and 130B is in a range from about 4 to about 6. In some embodiments, the thickness of the metal material 140 formed on the dielectric layer 118 is in a range from about 12 nm to about 13 nm. In some embodiments, the thickness of the metal material 140 formed on the bottoms of the openings 130A and 130B is in a range from about 7 nm to about 8 nm. In some embodiments, the thickness of the metal material 140 formed on the sidewalls of the openings 130A and 130B is in a range from about 4 nm to about 6 nm.

Figure 1E:
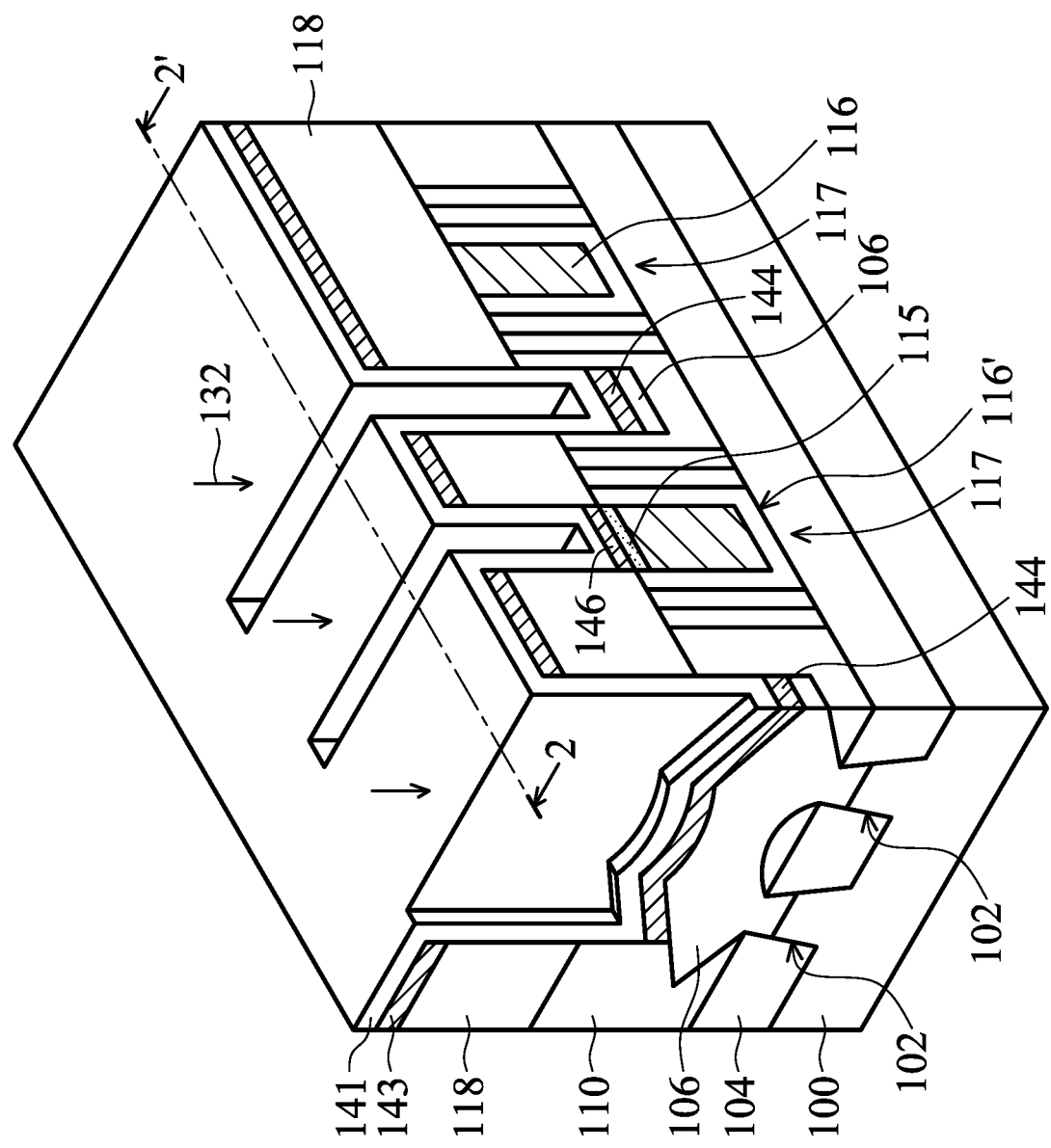
Figure 2E:
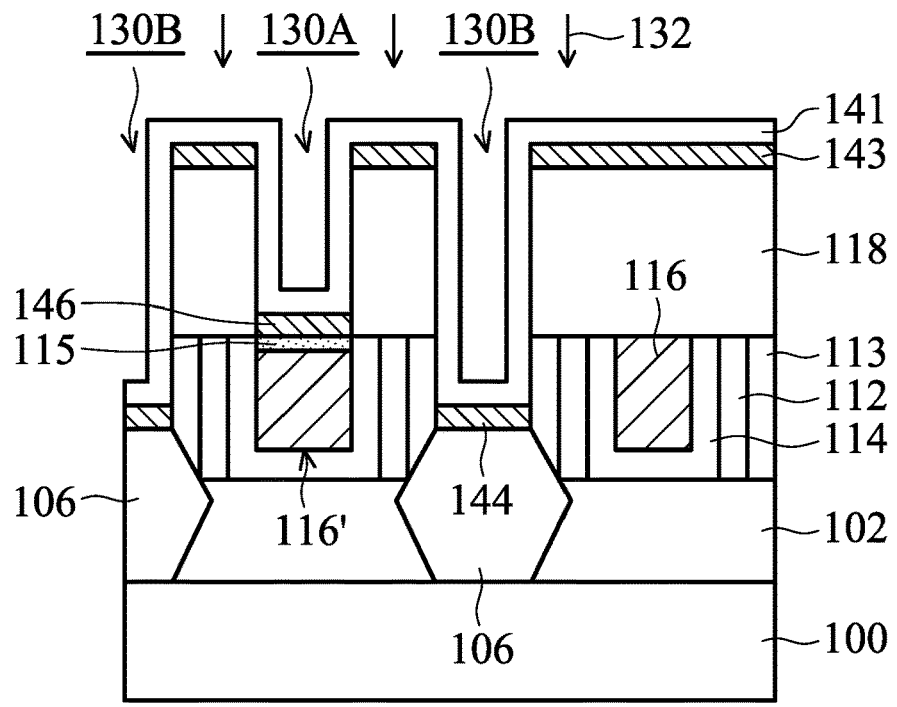

Afterwards, a nitriding operation 132 is used for nitriding a portion of the metal material 140 to form a metal nitride layer 141 over remaining portions (e.g. remaining portions 143, 144 and 146) of the metal material 140 as shown in FIGS. 1E and 2E, in accordance with some embodiments. The metal nitride layer 141 may be used for protecting the remaining portions 143, 144 and 146 of the metal material 140 from being oxidized or contamination, so that resistance between a metal-semiconductor compound layer to be formed from the remaining portion 144 and a metal contact feature to be formed over the epitaxial structure 106 can be reduced. In some embodiments, the metal nitride layer 141 is made of titanium nitride, nickel nitride, cobalt nitride, germanium nitride, one or more other applicable metal nitride materials, or a combination thereof.

In some embodiments, during the nitriding operation 132, the metal material 140 is exposed to a nitrogen-containing gas at an elevated temperature. In some embodiments, the nitrogen-containing gas includes ammonia ($NH_3$), nitrogen gas, one or more other applicable nitrogen-containing gases, or a combination thereof. In some embodiments, the operation temperature may be in a range from about 400 degrees C. to about 550 degrees C. In some embodiments, plasma is applied during the nitriding operation 132 to enhance the adhesion between the as-formed metal nitride layer 141 and the remaining portions 143, 144 and 146 of the metal material 140.

In some embodiments, the metal material 140 formed on the sidewalls of the openings 130A and 130B are substantially nitrided into the metal nitride layer 141, as shown in FIGS. 1E and 2E. In some embodiments, the remaining portion 143 of the metal material 140 is between the metal nitride layer 141 and the dielectric layer 118, the remaining portions 144 of the metal material 140 are contacting the epitaxial structures 106, and the remaining portion 146 of the metal material 140 is between the metal nitride layer 141 and the native oxide layer 115, as shown in FIGS. 1E and 2E. In some embodiments, the metal nitride layer 141 has a thickness that is in a range from about 4 nm to about 6 nm, which may be controlled by the operation time. In some embodiments, the remaining portion 143 of the metal material 140 has a thickness that is in a range from about 7 nm to about 8 nm. In some embodiments, the remaining portion 144 of the metal material 140 has a thickness that is in a range from about 4 nm to about 6 nm. In some embodiments, the remaining portion 146 of the metal material 140 has a thickness that is in a range from about 4 nm to about 6 nm.

Figure 1F:
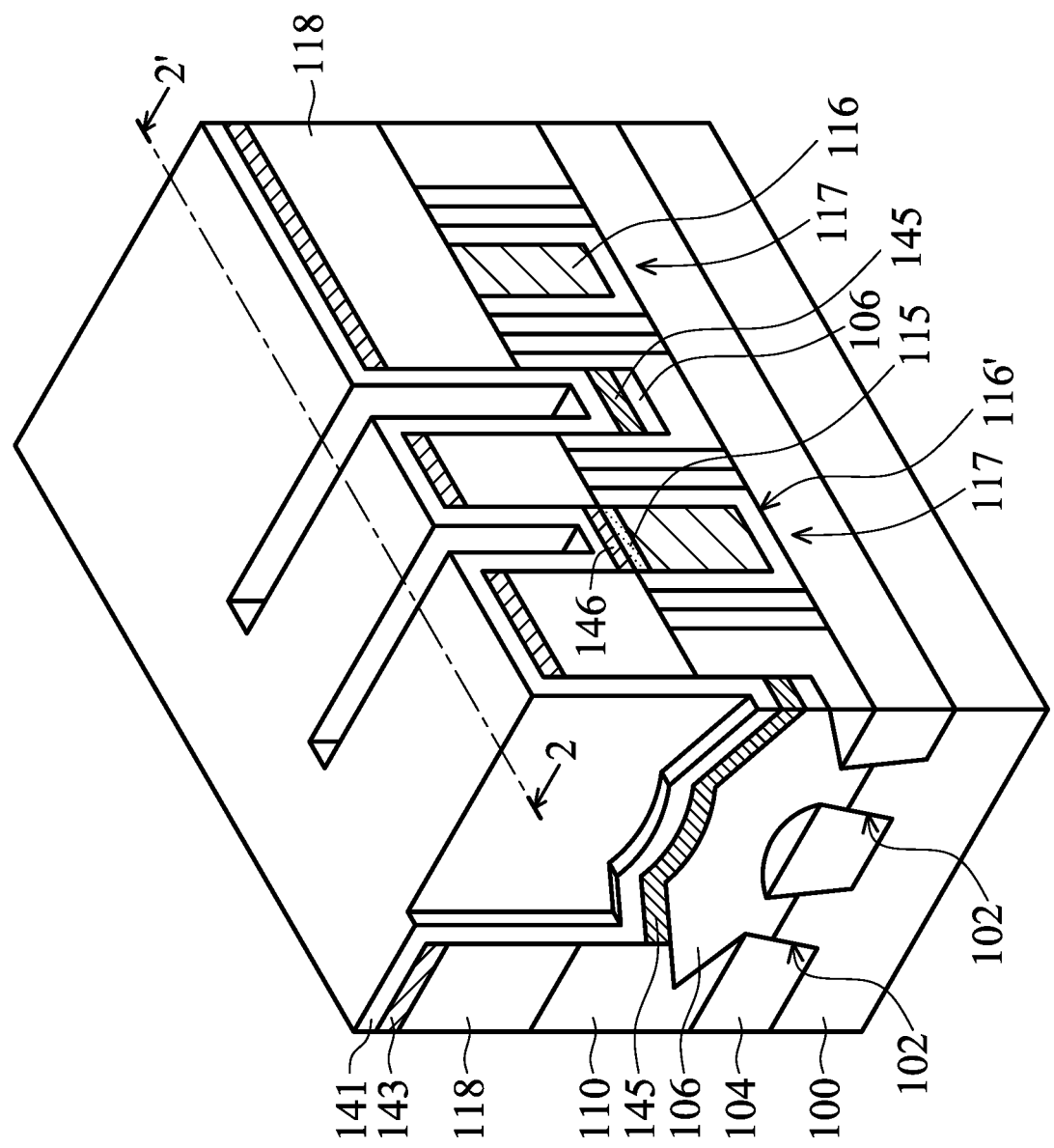
Figure 2F:
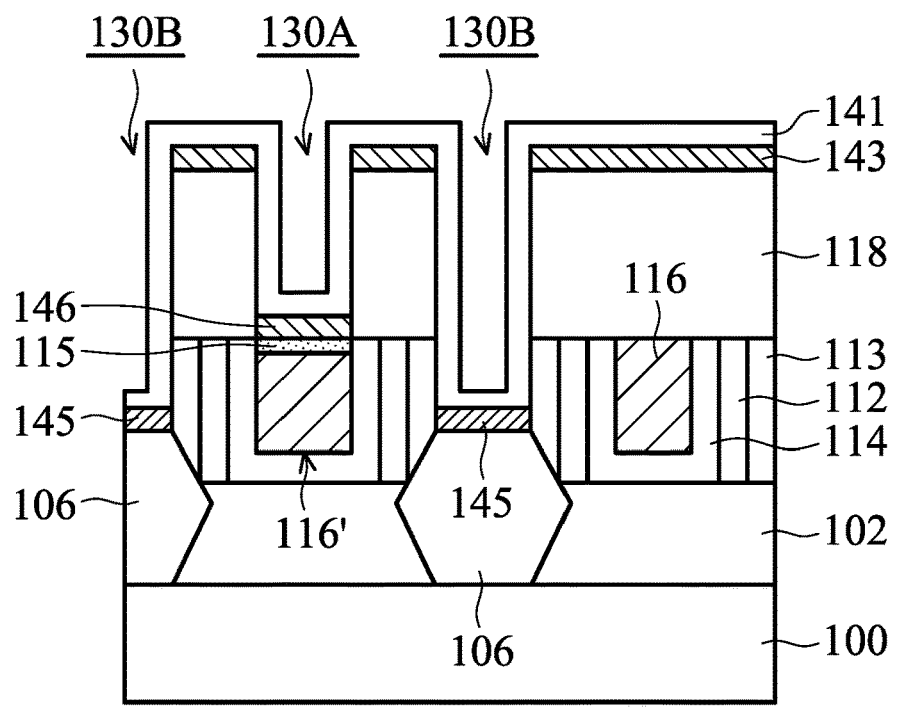

Afterwards, the epitaxial structure 106 and the metal-containing layer including the metal nitride layer 141 and the remaining portions 144 of the metal material 140 are heated to transform a first portion of the metal-containing layer contacting the top surfaces of the epitaxial structures 106 into metal-semiconductor compound layers 145 as shown in FIGS. 1F and 2F, in accordance with some embodiments. In some embodiments, the first portion of the metal-containing layer is included within the remaining portions 144 of the metal material 140. The metal-semiconductor compound layer 145 formed over the epitaxial structure 106 can help to reduce resistance between the epitaxial structure 106 and a metal contact feature to be formed over the epitaxial structure 106. In some embodiments, the metal-semiconductor compound layer 145 is made of a metal silicide material. In some embodiments, the metal-semiconductor compound layer 145 is made of titanium silicide. In some embodiments, the metal-semiconductor compound layer 145 is made of nickel silicide, cobalt silicide, germanium silicide, one or more other applicable metal silicide materials, or a combination thereof. In some embodiments, the metal-semiconductor compound layer 145 has a thickness that is in a range from about 4 nm to about 6 nm.

In some embodiments, a rapid thermal annealing (RTA) process is used to form the metal-semiconductor compound layer 145. In some embodiments, the operation temperature is in a range from about 500 degrees C. to about 650 degrees C. (e.g. about 575 degrees C.). In some embodiments, the operation time is in a range from about 10 seconds to about 30 seconds (e.g. about 15 seconds).

In some embodiments, a portion of the top surface of the epitaxial structure 106 is modified to have lower crystallinity than that of an inner portion of the epitaxial structure 106. The lower crystallinity of the portion of the top surface can facilitate the subsequent formation of the metal-semiconductor compound layer 145. The portion of the top surface may be modified using an ion implantation process. In some embodiments, because the metal-containing layer is in contact with the top surface of the epitaxial structure 106 during the heating, the thermal energy can help to initiate a chemical reaction between the portion of the top surface of the epitaxial structure 106 and the metal-containing layer. As a result, a portion (e.g. the portion with low crystallinity) of the top surface of the epitaxial structure 106 reacts with the metal-containing layer (e.g. the remaining portion 144 of the metal material 140) and is transformed into the metal-semiconductor compound layer 145, in accordance with some embodiments. In some embodiments, after the metal-semiconductor compound layer 145 is formed, the remaining portions 143 and 146 of the metal material 140 formed on the dielectric layer 118 remains untransformed. In some embodiments, the remaining portion 144 of the metal material 140 may not be fully transformed into the metal-semiconductor compound layer 145, and a residual part (not shown) of the remaining portion 144 of the metal material 140 may remain untransformed between the metal-semiconductor compound layer 145 and the metal nitride layer 141.

Figure 1G:
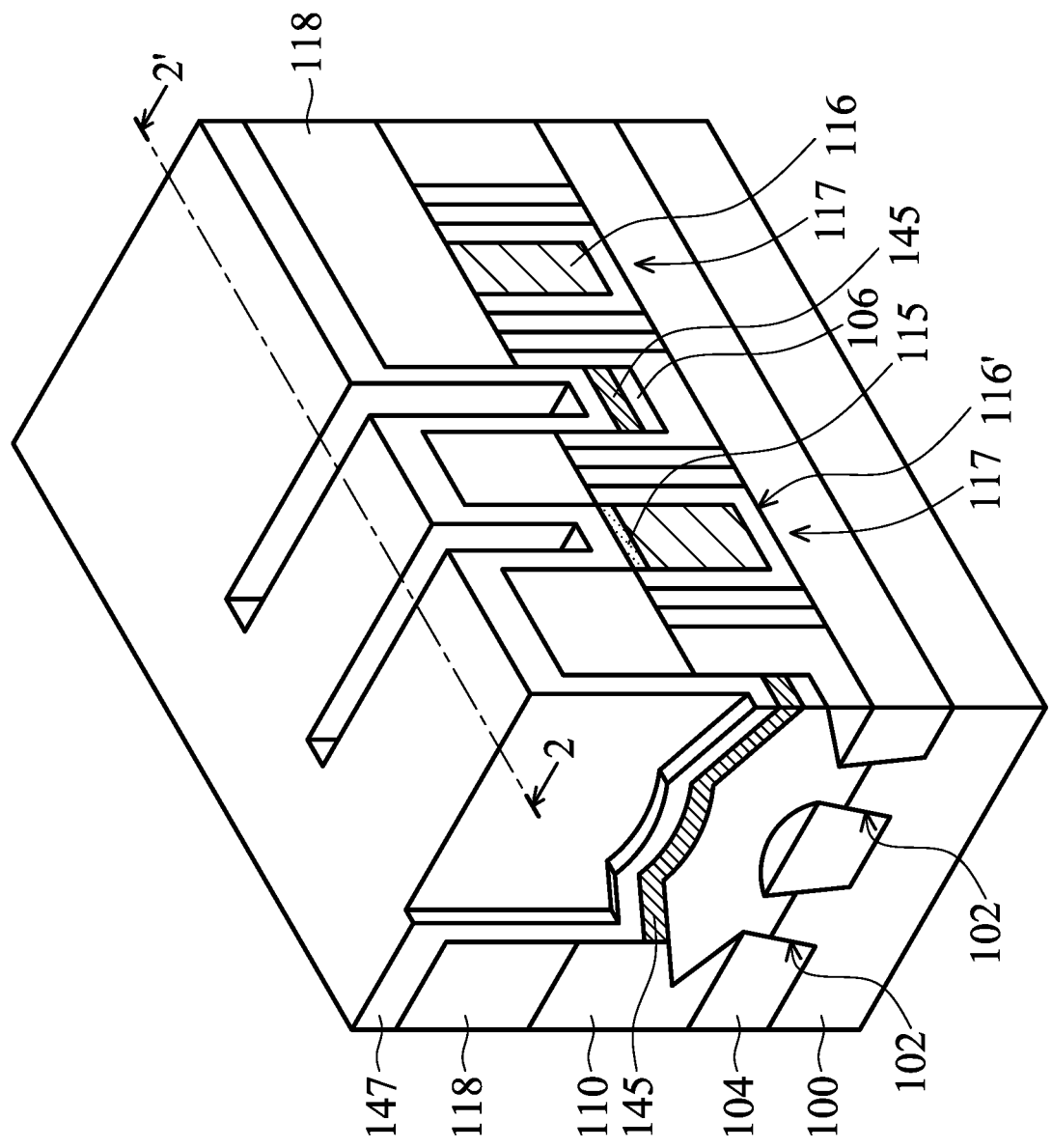
Figure 2G:
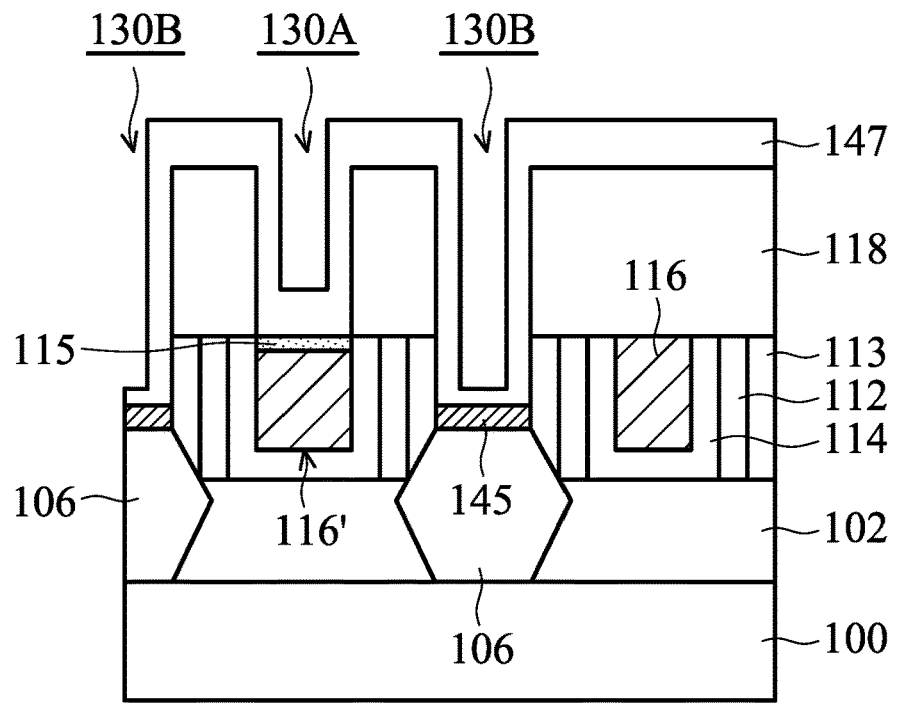

Afterwards, the metal-containing layer is oxidized to transform a second portion of the metal-containing layer over the metal-semiconductor compound layers 145, the metal layer 116', and the dielectric layer 118 into a metal oxide layer 147 as shown in FIGS. 1G and 2G, in accordance with some embodiments. In some embodiments, the metal nitride layer 141, the remaining portions 143 and 146 of the metal material 140, and optionally the residual part (not shown) of the remaining portion 144 of the metal material 140 on the metal-semiconductor compound layer 145 are oxidized into the metal oxide layer 147. In some embodiments, the metal oxide layer 147 is made of titanium oxide. In some embodiments, the metal oxide layer 147 is made of nickel oxide, cobalt oxide, germanium oxide, one or more other applicable metal oxide materials, or a combination thereof. In some embodiments, oxidizing the metal-containing layer includes performing a plasma oxidation process, a thermal oxidation process, or a combination thereof on the metal-containing layer.

In some embodiments, a plasma oxidation process is used to form the metal oxide layer 147 as shown in FIGS. 1G and 2G. The operation temperature of the plasma oxidation process may be in a range from about 160 degrees C. to about 250 degrees C. The flow rate of oxygen gas may be in a range from about 2000 sccm to about 6000 sccm. Oxygen ($O_2$) plasma may be applied on the metal-containing layer. The $O_2$ plasma oxidation may be conducted with a source power that is in a range from about 100 W to about 1500 W and optionally with a bias power that is in a range from about 10 W to about 100 W. In some embodiments, argon gas is also used.

In some embodiments, a thermal oxidation process in air, $He/O_2$, $Ar/O_2$, or any combination thereof is used to form the metal oxide layer 147 as shown in FIGS. 1G and 2G. The operation temperature of the thermal oxidation process may be in a range from about 400 degrees C. to about 550 degrees C.

Figure 1H:
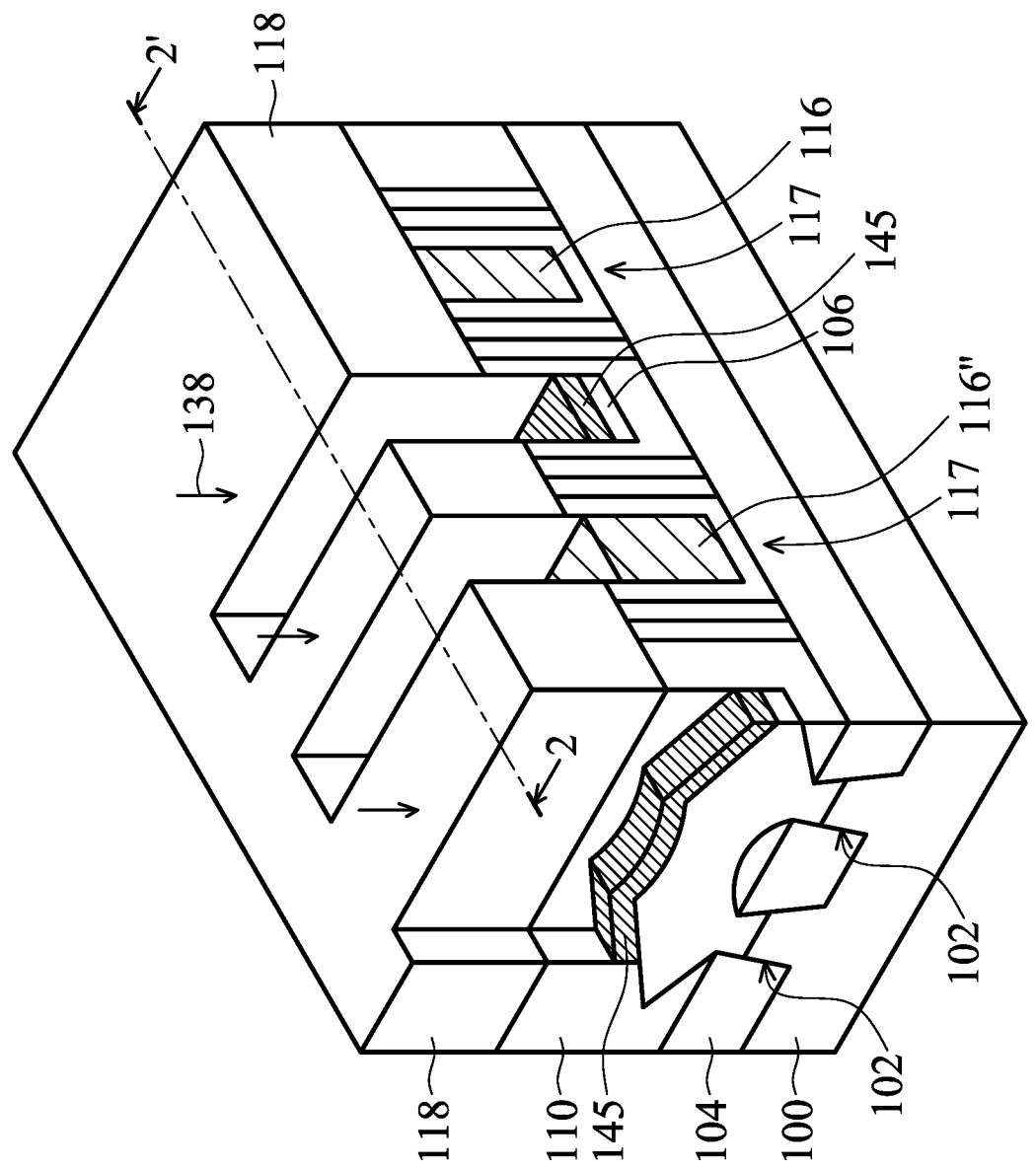
Figure 2H:
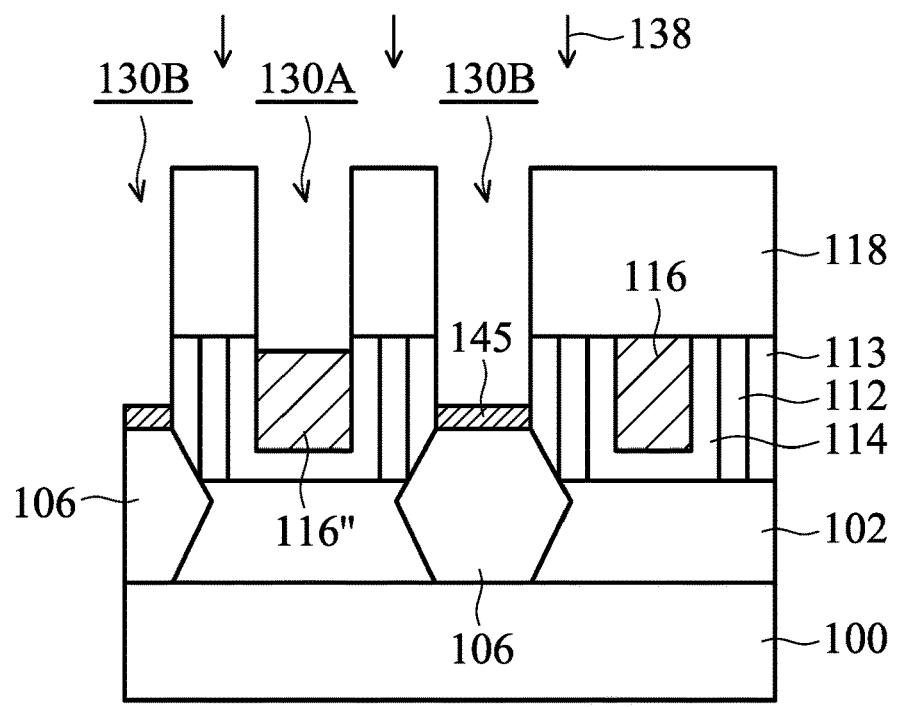

Afterwards, a metal chloride-containing etching gas is applied on the metal oxide layer 147 to remove the metal oxide layer 147, and the metal chloride-containing etching gas is applied on the metal layer 116' to remove the native oxide layer 115 of the metal layer 116' so as to form a recessed metal layer 116", as shown in FIGS. 1H and 2H, in accordance with some embodiments. In some embodiments, the metal chloride-containing etching gas removes the metal oxide layer 147 and exposes top surfaces of the metal-semiconductor compound layers 145 and the top surface of the recessed metal layer 116", as shown in FIGS. 1H and 2H. In some embodiments, a top surface of the recessed metal layer 116" is below a top surface of the high-k dielectric layer 114 as shown in FIGS. 1H and 2H. In some embodiments, the metal chloride-containing etching gas is made of $TaCl_5$. In some embodiments, the metal chloride-containing etching gas is made of $MoCl_5$, $WCl_5$, $BCl_3$, or a combination thereof.

In some embodiments, a dry etch process 138 is used to provide the metal chloride-containing etching gas to remove the metal oxide layer 147 and the native oxide layer 115 as shown in FIGS. 1H and 2H. In some embodiments, the operation temperature is in a range from about 300 degrees C. to about 500 degrees C. In some embodiments, the operation pressure is in a range from about 5 torrs to about 15 torrs. The removal of the metal oxide layer 147 and the native oxide layer 115 involves a chemical reaction between the metal chloride-containing etching gas and the oxides of the metal oxide layer 147 and the native oxide layer 115 at an elevated temperature, and this chemical reaction produces oxygen-containing gaseous products that can be removed, in accordance with some embodiments. Accordingly, such reaction mechanism can help the structure underneath the metal oxide layer 147 and the native oxide layer 115 to remain intact (e.g. the dimensions and the morphology of the structure including the metal-semiconductor compound layers 145 and the recessed metal layer 116" remaining unchanged) after the removal of the metal oxide layer 147 and the native oxide layer 115. In addition, because the metal nitride layer 141 and the remaining portions 143, 144 and 146 of the metal material 140 are removed by oxidation and dry etch, the space for each of the subsequently formed metal contact features is enlarged, and resistance between the metal-semiconductor compound layer 145 and a subsequently formed metal contact feature can be reduced.

Figure 1I:
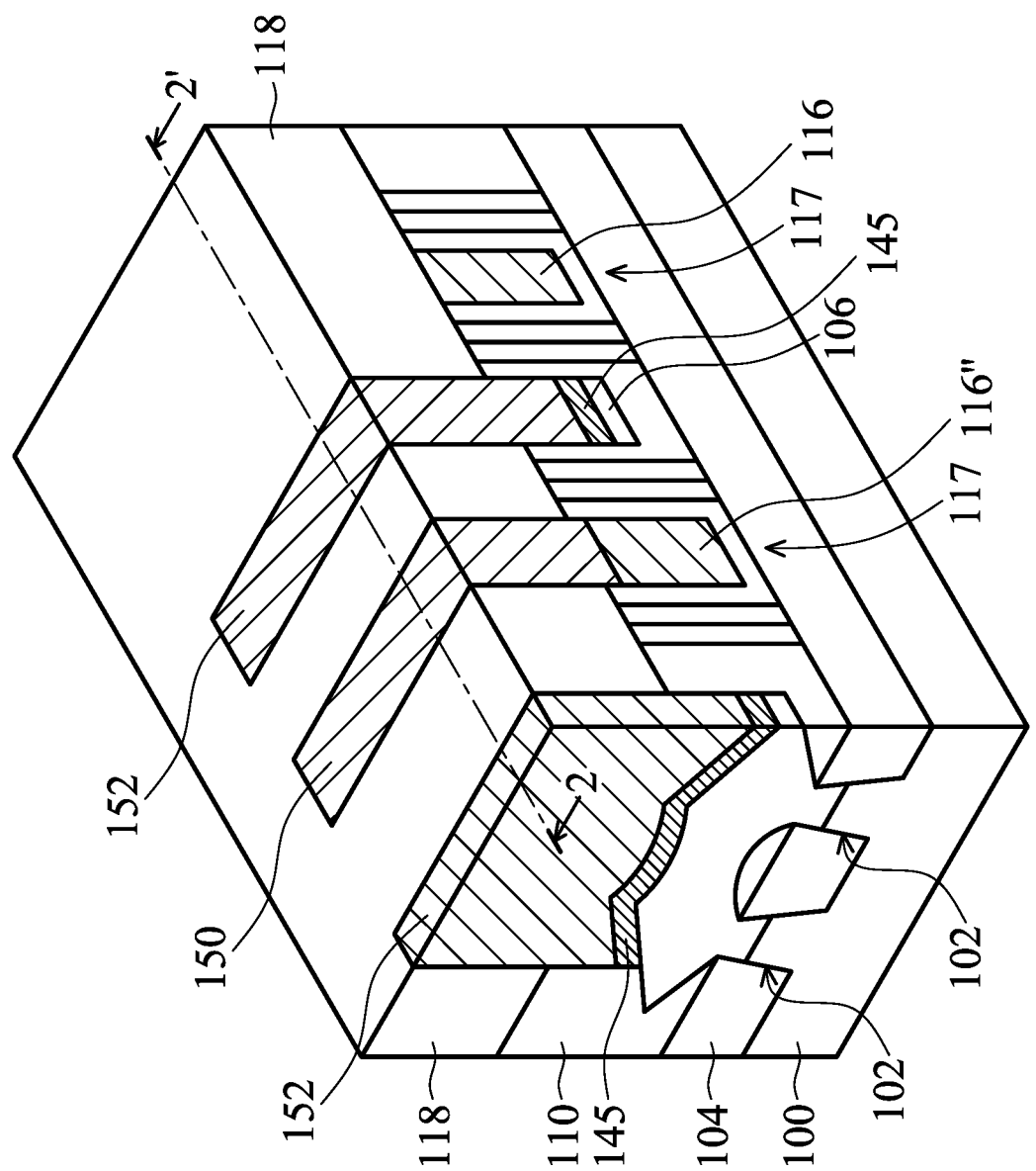
Figure 2I:
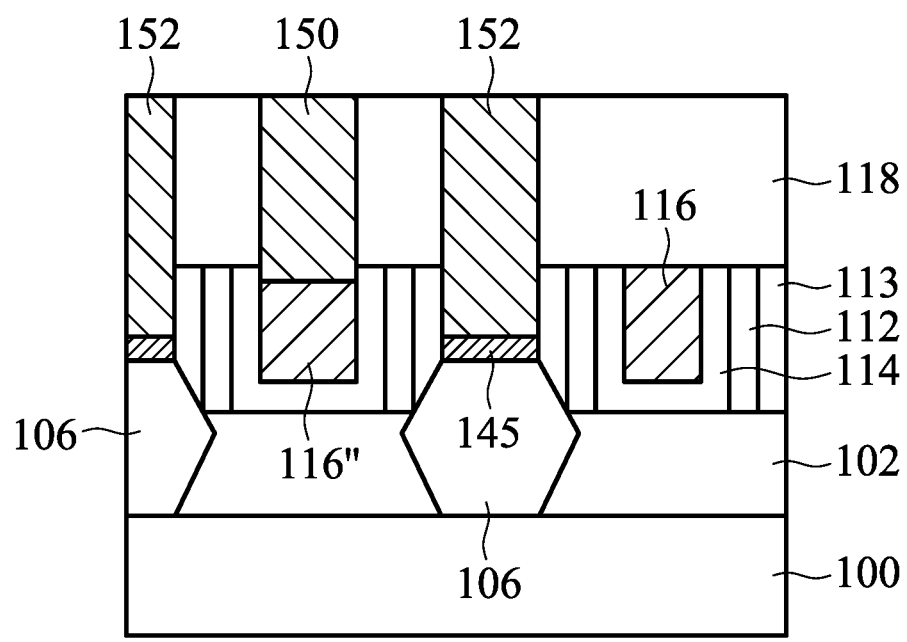

Afterwards, a metal contact feature 150 is formed over the top surface of the recessed metal layer 116", and metal contact features 152 are formed over the top surfaces of the metal-semiconductor compound layers 145, as shown in FIGS. 1I and 2I, in accordance with some embodiments. In some embodiments, each of the metal contact features 150 and 152 is made of ruthenium. In some embodiments, each of the metal contact features 150 and 152 is made of cobalt, molybdenum, one or more other applicable materials, or a combination thereof. In some embodiments, the metal contact features 150 and 152 are selectively grown on the recessed metal layer 116" and the metal-semiconductor compound layer 145, respectively, so that the metal contact features 150 and 152 may have substantially seamless structure, and contact resistance can be reduced.

In some embodiments, a CVD process is used to form the metal contact features 150 and 152. In some embodiments, the operation temperature is in a range from about 100 degrees C. to about 200 degrees C. In some embodiments, the operation pressure is in a range from about 5 torrs to about 15 torrs. In some embodiments, the reaction gas used for forming the metal contact features 150 and 152 includes $Ru_3(CO)_{12}$, $C_5HS(CO)_2Co$, $Co_2(CO)_8$, $Mo(CO)_6$, one or more other applicable precursors, or a combination thereof. In some embodiments, $H_2$ and/or Ar are also used. The thickness of the metal contact features 150 and 152 may be in a range from about 300 Å to about 1500 Å, which may be controlled by adjusting the operation time.

Afterwards, in some embodiments, a planarization process (not shown) is used to provide the metal contact features 150 and 152 with substantially planar top surfaces as shown in FIGS. 1I and 2I. The planarization process may include a chemical mechanical polishing (CMP) process, a dry polishing process, an etching process, a grinding process, one or more other applicable processes, or a combination thereof. In some embodiments, the top surfaces of the metal contact features 150 and 152 are substantially coplanar with the top surface of the dielectric layer 118, as shown in FIGS. 1I and 2I.

In some other embodiments, an atomic layer deposition (ALD) process is used to form the metal contact features 150 and 152. In some embodiments, the operation temperature is in a range from about 300 degrees C. to about 550 degrees C. In some embodiments, the operation pressure is in a range from about 15 torrs to about 40 torrs. In some embodiments, the reaction gas used for forming the metal contact features 150 and 152 includes a metal chloride-containing gas. In some embodiments, the reaction gas used for forming the metal contact features 150 and 152 includes $RuCl_3$, $MoCl_5$, one or more other applicable precursors, or a combination thereof. The metal chloride-containing gas used as the reaction gas in the ALD process may also act as an etching gas to clean the slightly oxidized surfaces which the metal contact features 150 and 152 are selectively grown on, followed by continuing to selectively form the metal contact features 150 and 152. Accordingly, it can help to reduce resistance between the metal contact features 150 and 152 and the device elements (e.g. the conductive features including the metal gate stack 117 and the epitaxial structure 106) thereunder. In some embodiments, $H_2$ and/or Ar are also used. The thickness of each of the metal contact features 150 and 152 may be in a range from about 300 Å to about 1500 Å, which may be controlled by adjusting the cycle number of the ALD process.

In some embodiments, the reaction gas used for forming the metal contact features 150 and 152 is substantially fluorine free, so that the device elements thereunder can be prevented from being negatively affected by fluorine.

Figure 6:
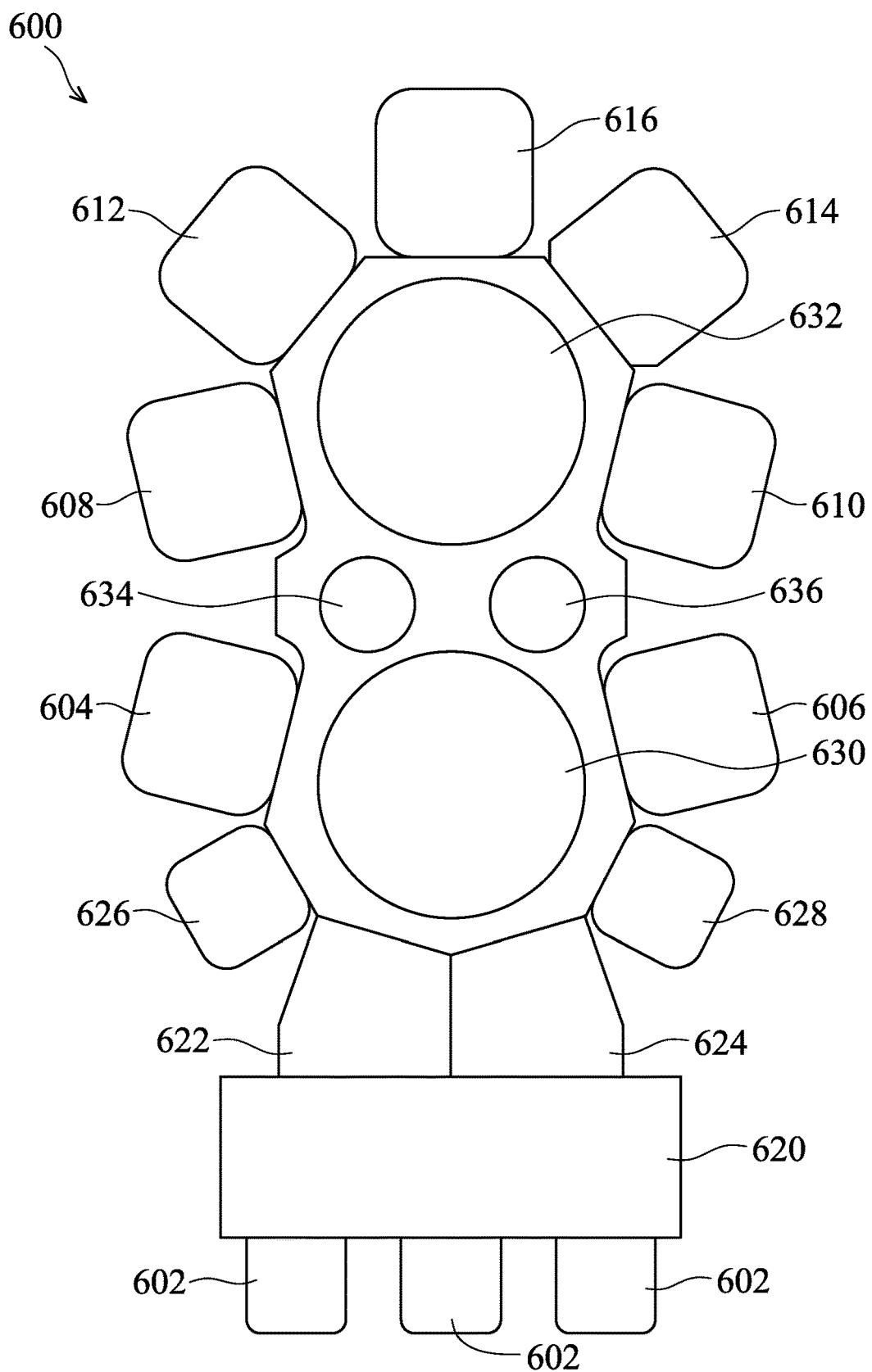
FIG. 6 shows an in-situ cluster tool used in a process for forming a semiconductor structure, in accordance with some embodiments of the disclosure.

In some embodiments, the application of the metal chloride-containing etching gas to remove the metal oxide layer 147 and the native oxide layer 115 as illustrated in FIGS. 1H and 2H and the formation of the metal contact features 150 and 152 as illustrated in FIGS. 1I and 2I are in-situ performed using the same process tool, e.g. the in-situ cluster tool 600 as shown in FIG. 6 in accordance with some embodiments, details of which will be discussed hereinafter. Since the above processes may be in-situ performed in the same process tool, the recessed metal layer 116" and the metal-semiconductor compound layer 145 can be prevented from oxidized or polluted due to transferring between different process tools. Therefore, the interface between the metal contact feature 150 and the recessed metal layer 116" and the interface between the metal contact feature 152 and the metal-semiconductor compound layer 145 can be substantially free from oxidation. Accordingly, the semiconductor structure can be prevented from polluted or damaged. In addition, the electrical connection between the metal contact features 150 and 152 and the conductive features including the metal gate stack 117 and the epitaxial structure 106 can be greatly improved.

In the embodiments illustrated in FIGS. 1A to 1I and FIGS. 2A to 2I, one metal contact structure including one metal contact feature 150 and two metal contact structures each including one metal contact feature 152 are formed on the top surface of the recessed metal layer 116" and the metal-semiconductor compound layers 145, respectively, leaving at least one metal layer 116 covered by the dielectric layer 118. However, many variations and/or modifications can be made to embodiments of the disclosure. In some embodiments, the numbers of the metal contact feature(s) 150, the metal contact feature(s) 152, and the metal layer(s) 116 left un-connected to any metal contact features 150 and 152 may vary according to different needs.

Figure 3A:
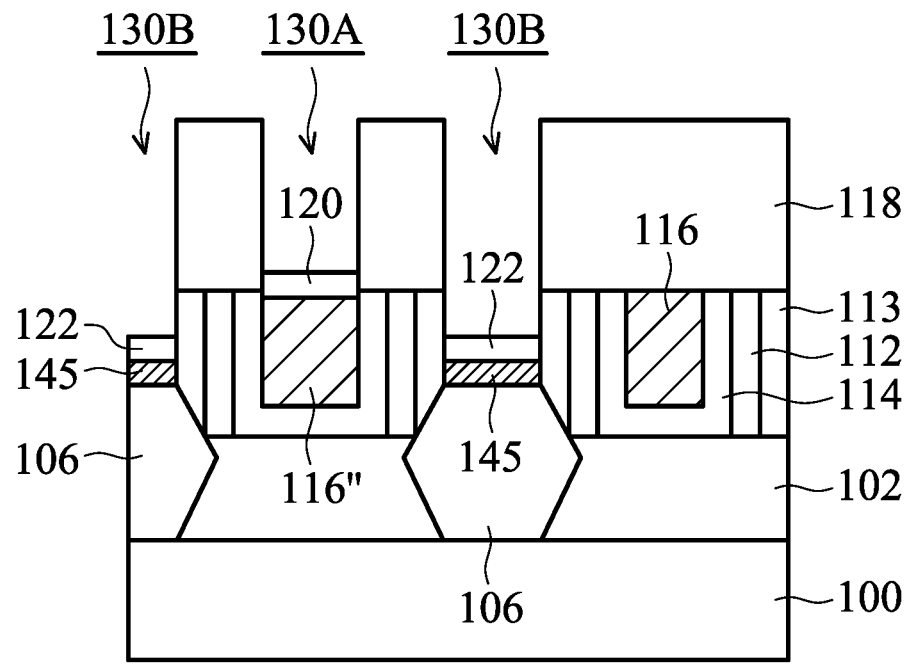
FIGS. 3A-3B are cross-sectional views of various stages of a process for forming a semiconductor structure, in accordance with some embodiments of the disclosure.
Figure 3B:
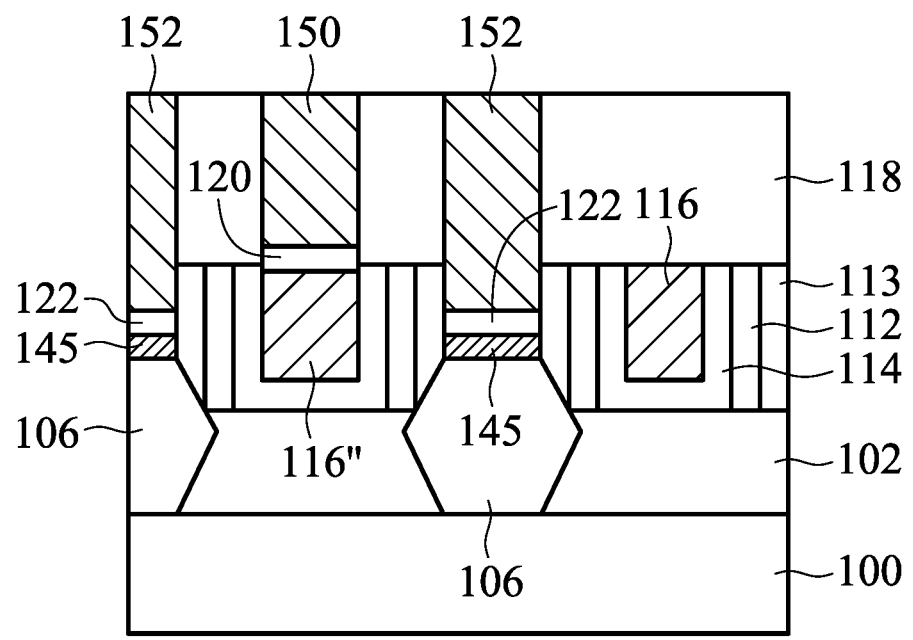

Many variations and/or modifications can be made to embodiments of the disclosure. FIGS. 3A-3B are cross-sectional views of various stages of a process for forming a semiconductor structure 200, in accordance with some embodiments of the disclosure. In some embodiments, a metal-containing precursor is applied on the recessed metal layer 116" to selectively form a metal-containing element 120 on the recessed metal layer 116", and the metal-containing precursor is applied on the metal-semiconductor compound layer 145 to form a metal-containing element 122 on each of the metal-semiconductor compound layers 145, as shown in FIG. 3A. The metal-containing precursor may act as a selective metal growth precursor to selectively form the metal-containing elements 120 and 122 on the recessed metal layer 116" and the metal-semiconductor compound layer 145, respectively. The metal-containing elements 120 and 122 may act as seed layers for the metal contact features 150 and 152 to be formed thereon subsequently.

In some embodiments, the metal-containing precursor includes a tungsten-containing precursor. The tungsten-containing precursor may include $WCl_5$, and the metal-containing elements 120 and 122 may be made of tungsten. In some embodiments, the metal-containing precursor is substantially fluorine free. Because the metal-containing precursor is substantially fluorine free, the device elements thereunder can be prevented from being negatively affected by fluorine. In some embodiments, the metal-containing precursor is selectively applied on the recessed metal layer 116" and the metal-semiconductor compound layer 145 using an atomic layer deposition (ALD) process. In some embodiments, each of the metal-containing elements 120 and 122 has a thickness that is in a range from about 2 nm to about 4 nm, so that resistance between the metal-semiconductor compound layer 145 and the metal contact features 152 to be formed thereon can be reduced, and resistance between the recessed metal layer 116" and the metal contact feature 150 to be formed thereon can be reduced.

In some embodiments, the operation temperature of the ALD process is in a range from about 300 degrees C. to about 550 degrees C. In some embodiments, the operation pressure of the ALD process may be in a range from about 15 torrs to about 40 torrs. In some embodiments, each of the metal-containing elements 120 and 122 may have a thickness that is in a range from about 10 Å to about 50 Å. The cycle number of the ALD process may be adjusted to control the thicknesses of the metal-containing elements 120 and 122.

In some embodiments, the metal-containing precursor includes $TaCl_5$, $MoCl_5$, or a combination thereof. In these cases, the metal-containing elements 120 and 122 may be made of Ta or Mo.

In some embodiments, the top surfaces of the recessed metal layer 116" and the metal-semiconductor compound layer 145 may be slightly oxidized to form native oxides on the top surfaces, and the metal-containing precursor may also act as an etching gas to remove the native oxides, followed by continuing to selectively form the metal-containing elements 120 and 122 on the recessed metal layer 116" and the metal-semiconductor compound layer 145, respectively. Thus, it can help to reduce resistance between the metal contact features 150 and 152 and the device elements (e.g. the conductive features including the metal gate stack 117 and the epitaxial structure 106) thereunder. In some embodiments, the metal-containing element 120 is directly contacting the top surface of the recessed metal layer 116" of the metal gate stack 117, and each of the metal-containing elements 122 is directly contacting each of the metal-semiconductor compound layers 145, as shown in FIG. 3A.

Afterwards, the metal contact feature 150 is selectively formed on the metal-containing element 120, and the metal contact features 152 are selectively formed on the metal-containing elements 122 as shown in FIG. 3B, in accordance with some embodiments.

In some embodiments, the application of the metal chloride-containing etching gas to remove the metal oxide layer 147 and the native oxide layer 115 as illustrated in FIGS. 1H and 2H, the formation of the metal-containing elements 120 and 122 as illustrated in FIGS. 3A and 3B, and the formation of the metal contact features 150 and 152 as illustrated in FIGS. 1I and 2I are in-situ performed using the same process tool, e.g. the in-situ cluster tool 600 as shown in FIG. 6 in accordance with some embodiments, details of which will be discussed hereinafter. Similarly, since the above processes may be in-situ performed in the same process tool, the recessed metal layer 116", the metal-semiconductor compound layer 145, and the metal-containing elements 120 and 122 can be prevented from oxidized or polluted due to transferring between different process tools. Therefore, the interfaces between the metal-containing elements 120 and 122 and the metal contact features 150 and 152, the interface between the metal-containing element 120 and the recessed metal layer 116", and the interface between the metal-containing elements 122 and the metal-semiconductor compound layers 145 can be substantially free from oxidation. Thus, the semiconductor structure is prevented from polluted or damaged. In addition, the electrical connection between the metal contact structures including the metal contact features 150 and 152 and the metal-containing elements 120 and 122 and the conductive features including the metal gate stack 117 and the epitaxial structure 106 can be greatly improved.

In some embodiments, the metal contact structures include the metal contact features 150 and 152 made of ruthenium and/or molybdenum and the metal-containing elements 120 and 122 made of tungsten. In some embodiments, the metal contact structures include the metal contact features 150 and 152 made of ruthenium and the metal-containing elements 120 and 122 made of molybdenum.

Figure 4A:
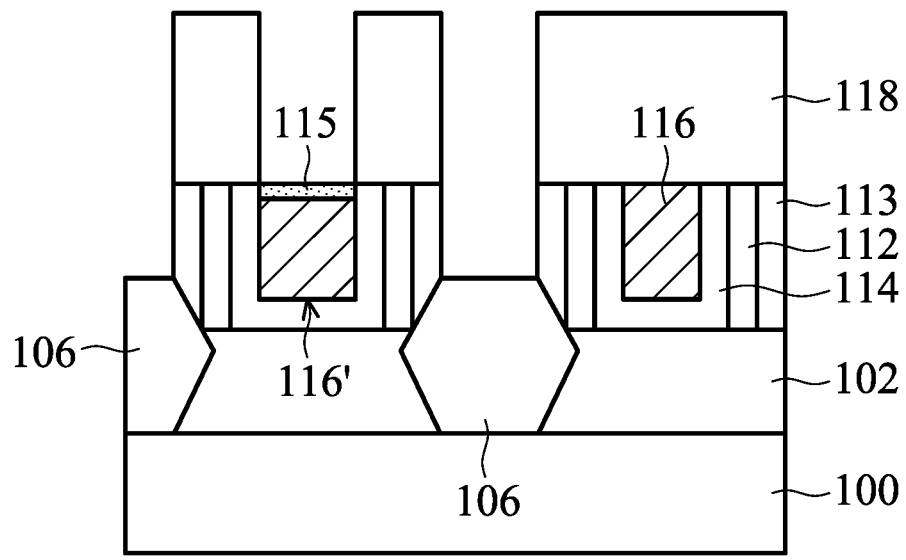
FIGS. 4A-4E are cross-sectional views of various stages of a process for forming a semiconductor structure, in accordance with some embodiments of the disclosure.

FIGS. 4A-4E are cross-sectional views of various stages of a process for forming a semiconductor structure, in accordance with some embodiments of the disclosure. As shown in FIG. 4A, a structure the same as or similar to that shown in FIG. 2C is formed, in accordance with some embodiments.

Figure 4B:
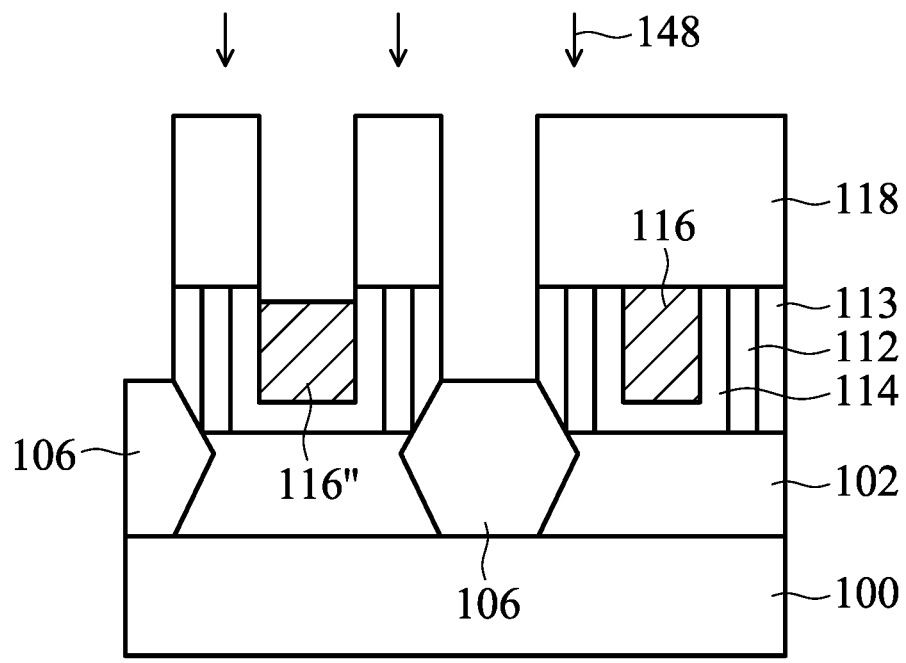

Afterwards, a metal chloride-containing etching gas that is the same as or similar to the metal chloride-containing etching gas illustrated in FIGS. 1H and 2H is applied on the metal layer 116' to remove the native oxide layer 115 so as to form a recessed metal layer 116", as shown in FIG. 4B, in accordance with some embodiments. In some embodiments, a dry etch process 148 that is the same as or similar to the dry etch process 138 illustrated in FIGS. 1H and 2H is used to provide the metal chloride-containing etching gas to remove the native oxide layer 115 as shown in FIG. 4B. In some embodiments, applying the metal chloride-containing etching gas on the metal layer 116' is prior to forming the metal-containing layer over the dielectric layer 118.

Figure 4C:
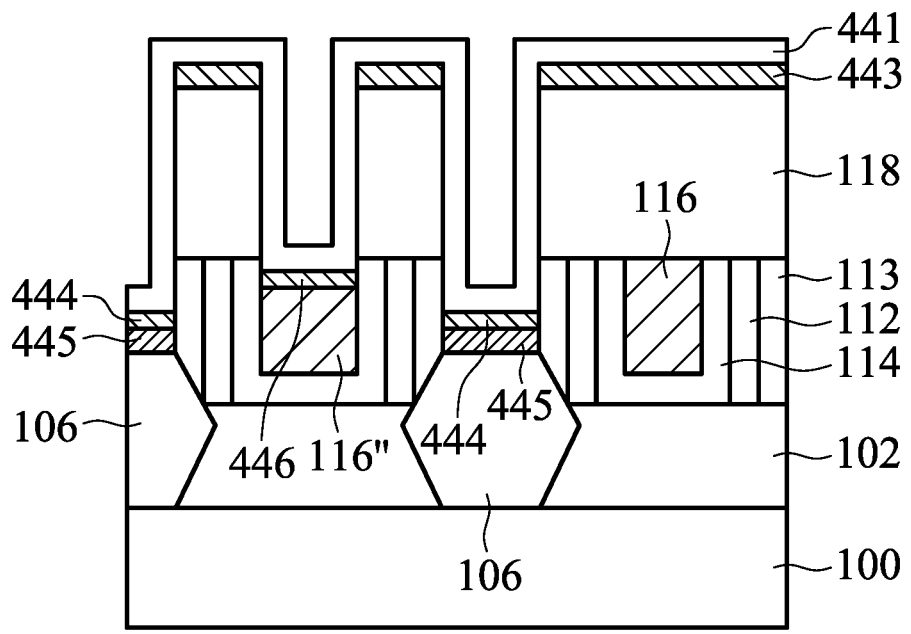

Afterwards, a metal material is deposited over the dielectric layer 118, the top surfaces of the epitaxial structures 106, and the recessed metal layer 116", and a portion of the metal material is nitride to form a metal nitride layer 441 over remaining portions (e.g. remaining portions 443, 444, and 446) of the metal material, as shown in FIG. 4C, in accordance with some embodiments. The material and the formation method of the metal-containing layer including the metal nitride layer 441 and the remaining portions 443, 444, and 446 of the metal material may be the same as or similar to those of the metal-containing layer including the metal nitride layer 141 and the remaining portions 143, 144, and 146 of the metal material 140 illustrated in FIGS. 1D to 1E and FIGS. 2D to 2E.

Afterwards, the epitaxial structures 106, the metal nitride layer 441, and the remaining portions 444 of the metal material are heated to transform a first portion of the metal-containing layer contacting the top surfaces of the epitaxial structures 106 into the metal-semiconductor compound layers 445 as shown in FIG. 4C, in accordance with some embodiments. The material and the formation method of the metal-semiconductor compound layer 445 may be the same as or similar to those of the metal-semiconductor compound layer 145 illustrated in FIGS. 1F and 2F.

In some embodiments, the remaining portion 444 of the metal material is not fully transformed into the metal-semiconductor compound layer 445, and a residual part (not shown) of the remaining portion 444 of the metal material remains untransformed between the metal-semiconductor compound layer 445 and the metal nitride layer 441. In some embodiments, the residual part of the remaining portion 444 is made of a material that is the same as or similar to that of the remaining portion 444 of the metal material. In some embodiments, the residual part of the remaining portion 444 has a thickness that is in a range from about 1 nm to about 2 nm. In some embodiments, the residual part of the remaining portion 444 may be in form of a thin intervening layer located between the metal-semiconductor compound layer 445 and the metal nitride layer 441.

Figure 4D:
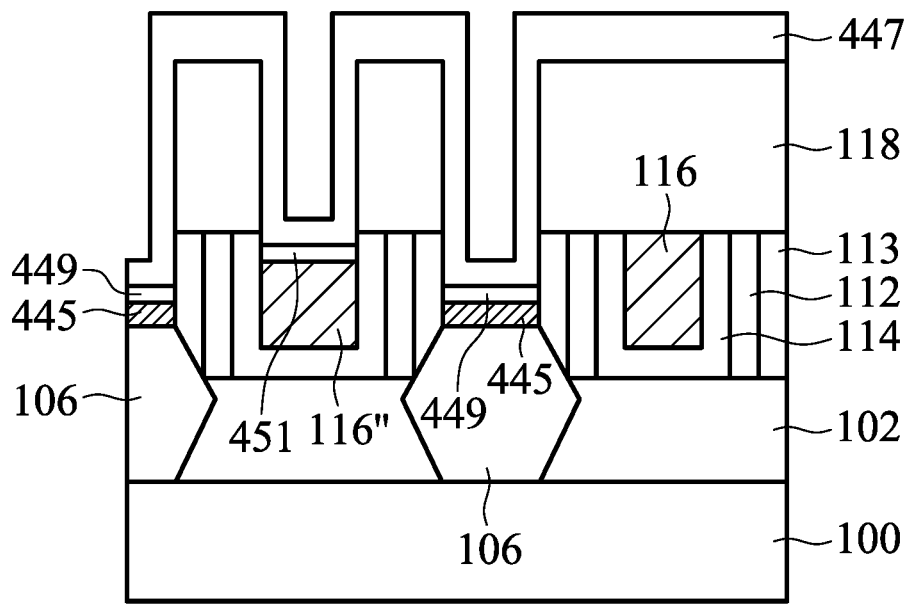

Afterwards, the metal-containing layer is oxidized to transform a second portion of the metal-containing layer over the metal-semiconductor compound layers 445, the recessed metal layer 116", and the dielectric layer 118 into a metal oxide layer 447 as shown in FIG. 4D, in accordance with some embodiments. The material and the formation method of the metal oxide layer 447 may be the same as or similar to those of the metal oxide layer 147 illustrated in FIGS. 1G and 2G.

After the metal-containing layer is oxidized, at least a third portion of the metal-containing layer may remain un-oxidized. Metal-containing portions 449 are formed between the metal-semiconductor compound layers 445 and the metal oxide layer 447, and a metal-containing portion 451 is formed on the recessed metal layer 116", as shown in FIG. 4D, in accordance with some embodiments. In some embodiments, the metal-containing portions 449 and 451 are made of the material of the metal nitride layer 441, the material of the remaining portions 443, 444, and 446 of the metal material, or a combination thereof. In some embodiments, the metal-containing portions 449 and 451 include the residual part of the remaining portion 444 of the metal material, so that the resistance between the epitaxial structure 106 and a metal contact feature to be formed over the metal-containing portion 449 and the metal-semiconductor compound layer 445 on the epitaxial structure 106 can be reduced, and the resistance between the recessed metal layer 116' and a metal contact feature to be formed over the metal-containing portion 451 can be reduced.

In some embodiments, a plasma oxidation process is used to form the metal oxide layer 447 and the remaining metal-containing portions 449 and 451 as shown in FIG. 4D. The operation temperature of the plasma oxidation process may be in a range from about 160 degrees C. to about 250 degrees C. The flow rate of oxygen gas may be in a range from about 2000 sccm to about 6000 sccm. Oxygen ($O_2$) plasma may be applied on the metal-containing layer. The $O_2$ plasma oxidation may be conducted with a source power that is in a range from about 100 W to about 1500 W and optionally with a bias power that is in a range from about 0 W to about 10 W. In some embodiments, argon gas is also used.

Figure 4E:
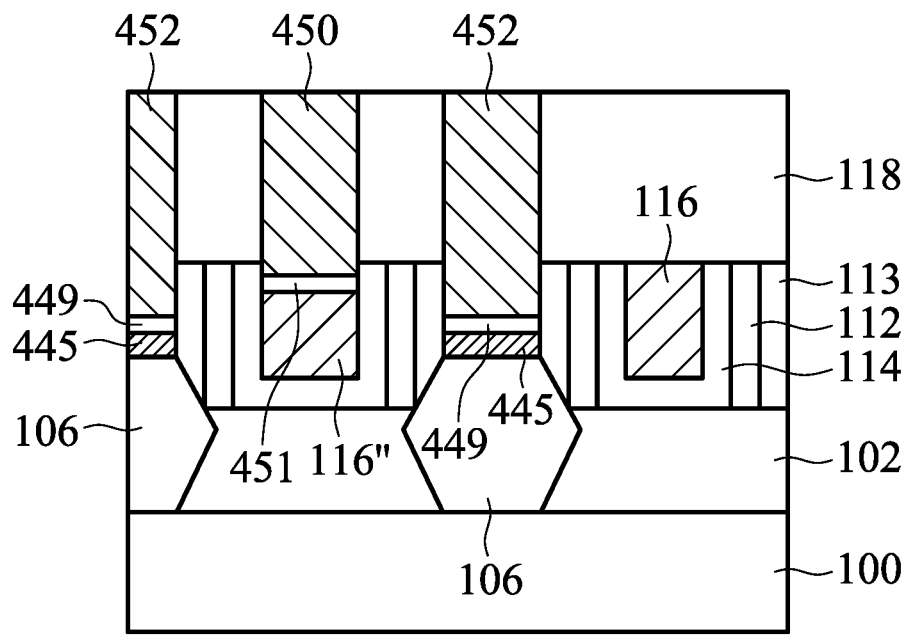

Afterwards, the metal oxide layer 447 is removed, and metal contact features 450 and 452 are selectively formed on the metal-containing portions 451 and 449, respectively, as shown in FIG. 4E, in accordance with some embodiments. The process used for removing the metal oxide layer 447 may be the same as or similar to that used for removing the metal oxide layer 147 as illustrated in FIGS. 1H and 2H. The material and the formation method of the metal contact features 450 and 452 may be the same as or similar to those of the metal contact features 150 and 152 illustrated in FIGS. 1I and 2I. In some embodiments, the metal contact structure including one metal-containing layer 450 and one metal-containing portion 451 is directly contacting the top surface of the recessed metal layer 116", and the metal contact structure including one metal-containing layer 452 and one metal-containing portion 449 is directly contacting the metal-semiconductor compound layer 445, as shown in FIG. 4E.

Figure 5:
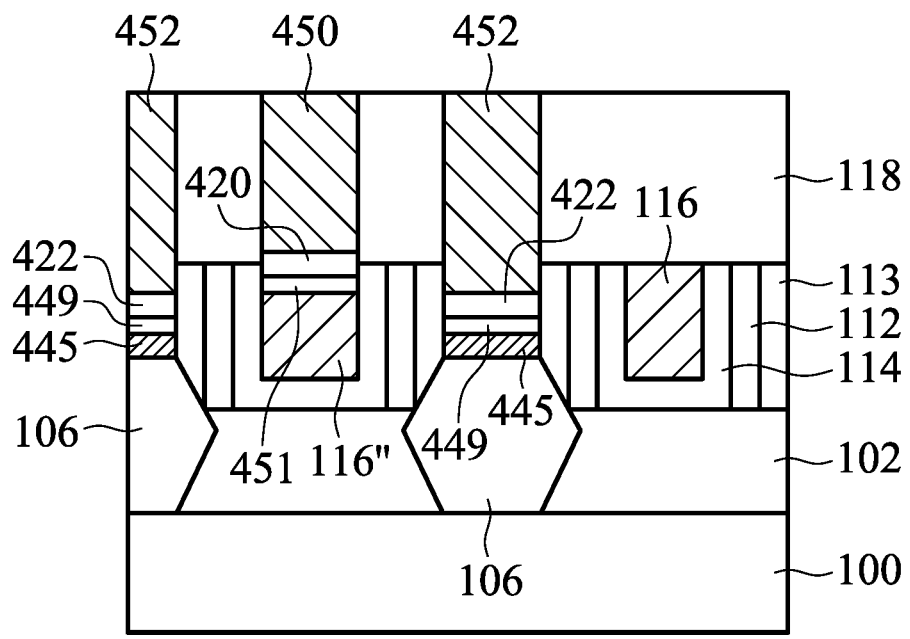
FIG. 5 is cross-sectional views of a semiconductor structure, in accordance with some embodiments of the disclosure.

Many variations and/or modifications can be made to embodiments of the disclosure. In some embodiments, metal-containing elements 420 and 422 are selectively formed on the recessed metal layer 116" and the metal-semiconductor compound layer 145, respectively. FIG. 5 is a cross-sectional view of a semiconductor structure, in accordance with some embodiments of the disclosure. In some embodiments, the metal contact features 450 and 452 are selectively formed on the metal-containing elements 420 and 422, respectively, as shown in FIG. 5. The material and the formation method of the metal-containing elements 420 and 422 may be the same as or similar to those of the metal-containing elements 120 and 122 illustrated in FIGS. 3A and 4A.

FIG. 6 shows an in-situ cluster tool 600 used in a process for forming a semiconductor structure, in accordance with some embodiments of the disclosure. The in-situ cluster tool 600 includes process chambers 604, 606, 608, 610, 612, 614, 616, 626, and 628, as shown in FIG. 6, in accordance with some embodiments. Each of these chambers may be used for performing a chemical vapor deposition (CVD) process, an atomic layer deposition (ALD) process, a physical vapor deposition (PVD) process, or a dry etch process. Moreover, in some embodiments, the in-situ cluster tool 600 also includes moving mechanisms 630 and 632 for moving a treated or untreated intermediate semiconductor structure from one chamber to another chamber, as shown in FIG. 6. In some embodiments, the in-situ cluster tool 600 also includes buffer chambers 634 and 636 for placing a treated or untreated intermediate semiconductor structure, as shown in FIG. 6. In addition, in some embodiments, the in-situ cluster tool 600 further includes loading chambers 622 and 624 connected to a buffer region 620, and the in-situ cluster tool 600 also includes load ducks 602 for connecting to other process tools, as shown in FIG. 6.

In some embodiments, the application of the metal chloride-containing etching gas to remove the metal oxide layer 147 and the native oxide layer 115 as illustrated in FIGS. 1H and 2H is performed in one of the process chambers 604 and 606 in the in-situ cluster tool 600, as shown in FIG. 6. In some embodiments, the formation of the metal contact features 150 and 152 as illustrated in FIGS. 1I and 2I is performed in one of the process chambers 608, 610 and 616 in the in-situ cluster tool 600 by chemical vapor deposition, as shown in FIG. 6. In some embodiments, the above processes as illustrated in FIGS. 1H, 2H, 1I and 2I are in-situ performed in the same in-situ cluster tool 600 without breaking vacuum, and therefore, the recessed metal layer 116" and the metal-semiconductor compound layer 145 can be prevented from oxidized or polluted due to transferring between different process tools.

In some embodiments, the formation of the metal-containing elements 120 and 122 as illustrated in FIGS. 3A and 3B is performed in one of the process chambers 612 and 614 in the in-situ cluster tool 600 by atomic layer deposition, as shown in FIG. 6. Similarly, in some embodiments, the above processes as illustrated in FIGS. 1H, 2H, 3A, 3B, 1I and 2I are in-situ performed in the same in-situ cluster tool 600 without breaking vacuum, and therefore, the recessed metal layer 116", the metal-semiconductor compound layer 145, and the metal-containing elements 120 and 122 can be prevented from oxidized or polluted due to transferring between different process tools.

As described previously, a portion of the metal material 140 is nitrided to form the metal nitride layer 141 over the remaining portions 143, 144 and 146 of the metal material 140. The metal nitride layer 141 may be used for protecting the remaining portions 143, 144 and 146 of the metal material 140 from being oxidized or contamination, so that resistance between the metal contact feature 152 and the metal-semiconductor compound layer 145 formed from the remaining portion 144 can be reduced. In addition, the metal oxide layer 147 and the native oxide layer 115 are removed by the metal chloride-containing etching gas which results in oxygen-containing gaseous products that can be removed, thus such reaction mechanism can help the structure underneath the metal oxide layer 147 and the native oxide layer 115 to remain intact.

Moreover, the reaction gas used for forming the metal contact features 150 and 152 is substantially fluorine free, so that the device elements thereunder can be prevented from being negatively affected by fluorine. Furthermore, applying the metal chloride-containing etching gas to remove the metal oxide layer 147 and the native oxide layer 115, forming the metal-containing elements 120 and 122, and forming the metal contact features 150 and 152 are in-situ performed using the same process tool. Therefore, the semiconductor structure can be prevented from polluted or damaged, and the electrical connection between the metal contact features 150 and 152, the metal-containing elements 120 and 122, and the conductive features including the metal gate stack 117 and the epitaxial structure 106 can be greatly improved.

Embodiments for forming a semiconductor structure are provided. The method for forming the semiconductor structure may include transforming a portion of a metal-containing layer over a conductive feature into a metal-semiconductor compound layer, and removing another portion of the metal-containing layer by oxidation and dry etch, such that the space for a subsequently formed metal contact feature can be enlarged, and resistance between the metal-semiconductor compound layer and the metal contact feature can be reduced. In addition, the metal contact feature may be selectively grown on the metal-semiconductor compound layer, thus the electrical connection between the metal contact feature and the metal-semiconductor compound layer can be greatly improved.

In accordance with some embodiments, a method for forming a semiconductor structure is provided. The method includes forming an epitaxial structure over a semiconductor substrate. The method also includes forming a dielectric layer covering the epitaxial structure. The method further includes forming an opening in the dielectric layer to expose a top surface of the epitaxial structure. In addition, the method includes forming a metal-containing layer over the dielectric layer and the top surface of the epitaxial structure. The method includes heating the epitaxial structure and the metal-containing layer to transform a first portion of the metal-containing layer contacting the top surface of the epitaxial structure into a metal-semiconductor compound layer. The method also includes oxidizing the metal-containing layer to transform a second portion of the metal-containing layer over the metal-semiconductor compound layer and the dielectric layer into a metal oxide layer. The method further includes applying a metal chloride-containing etching gas on the metal oxide layer to remove the metal oxide layer. In addition, the method includes forming a metal contact feature over the top surface of the metal-semiconductor compound layer.

In accordance with some embodiments, a method for forming a semiconductor structure is provided. The method includes forming a metal layer and an epitaxial structure over a semiconductor substrate. The method also includes forming a dielectric layer covering the metal layer and the epitaxial structure. The method further includes forming a first opening and a second opening in the dielectric layer to expose the metal layer and the epitaxial structure respectively. In addition, the method includes applying a metal chloride-containing etching gas on the metal layer to remove a native oxide layer of the exposed metal layer so as to form a recessed metal layer. The method further includes forming a metal contact feature over a top surface of the recessed metal layer.

In accordance with some embodiments, a semiconductor structure is provided. The semiconductor structure includes an epitaxial structure over the semiconductor substrate. The semiconductor structure also includes a conductive feature over the semiconductor substrate. The conductive feature includes a high-k dielectric layer and a metal layer on the high-k dielectric layer, and a top surface of the metal layer is below a top surface of the high-k dielectric layer. The semiconductor structure further includes a metal-semiconductor compound layer formed on the epitaxial structure. In addition, the semiconductor structure includes a first metal contact structure formed on the top surface of the metal layer of the conductive feature. The semiconductor structure further includes a second metal contact structure formed on the metal-semiconductor compound layer.

In accordance with some embodiments, a semiconductor structure is provided. The semiconductor structure includes an epitaxial structure over a substrate and a metal layer of a gate stack adjacent to the epitaxial structure over the substrate. The semiconductor structure also includes a metal-semiconductor compound layer on the epitaxial structure. The semiconductor structure further includes a first metal-containing element on the metal layer of the gate stack and a second metal-containing element on the metal-semiconductor compound layer. A top surface of the metal layer of the gate stack is higher than a top surface of the second metal-containing element. In addition, the semiconductor structure includes a first metal contact feature over the first metal-containing element and a second metal contact feature over the second metal-containing element.

In accordance with some embodiments, a semiconductor structure is provided. The semiconductor structure includes a source/drain structure over a semiconductor substrate and a gate stack adjacent to the source/drain structure over the semiconductor substrate. The semiconductor structure also includes a metal-semiconductor compound layer on the source/drain structure. The semiconductor structure further includes a first metal-containing portion on a metal layer of the gate stack and a second metal-containing portion on the metal-semiconductor compound layer. In addition, the semiconductor structure includes a first metal-containing element on the first metal-containing portion and a second metal-containing element on the second metal-containing portion. The semiconductor structure further includes a first metal contact feature on the first metal-containing element and a second metal contact feature on the second metal-containing element.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an epitaxial structure over a semiconductor substrate;
   a conductive feature over the semiconductor substrate, wherein the conductive feature comprises a high-k dielectric layer and a metal layer on the high-k dielectric layer, wherein a top surface of the metal layer is below a top surface of the high-k dielectric layer;
   a metal-semiconductor compound layer formed on the epitaxial structure;
   a first metal contact structure formed over the top surface of the metal layer of the conductive feature;
   a second metal contact structure formed over the metal-semiconductor compound layer;
   a spacer between the epitaxial structure and the conductive feature, wherein the spacer is in direct contact with a lower portion of the second metal contact structure; and
   a dielectric layer on the spacer, wherein an interface between the dielectric layer and an upper portion of the second metal contact structure is substantially aligned with an interface between the spacer and a lower portion of the second metal contact structure.

2. The semiconductor structure as claimed in claim 1, wherein the first metal contact structure and the second metal contact structure each comprises a metal contact feature, and the metal contact feature comprises ruthenium, cobalt, molybdenum, or a combination thereof.

3. The semiconductor structure as claimed in claim 1, wherein the first metal contact structure is in direct contact with a sidewall of the high-k dielectric layer of the conductive feature.

4. The semiconductor structure as claimed in claim 1, wherein the first metal contact structure is separated from the high-k dielectric layer of the conductive feature.

5. The semiconductor structure as claimed in claim 1, wherein a bottom surface of first metal contact structure is embedded in the conductive feature.

6. The semiconductor structure as claimed in claim 1, wherein a bottom surface of the second metal contact structure is lower than a top surface of the spacer.

7. The semiconductor structure as claimed in claim 1, wherein an interface between the dielectric layer and the spacer is higher than a bottom surface of the second metal contact structure.

8. The semiconductor structure as claimed in claim 1, wherein the upper portion of the second metal contact structure protrudes from the spacer, and the upper portion of the second metal contact structure and the lower portion of the second metal contact structure have same lateral width.

9. A semiconductor structure, comprising:
an epitaxial structure over a substrate;
a metal layer of a gate stack adjacent to the epitaxial structure over the substrate;
a metal-semiconductor compound layer on the epitaxial structure;
a first metal-containing element over the metal layer of the gate stack;
a second metal-containing element over the metal-semiconductor compound layer, wherein a bottom surface of the first metal-containing element is higher than a top surface of the second metal-containing element;
a first metal contact feature over the first metal-containing element;
a second metal contact feature over the second metal-containing element; and
a spacer on sidewalls of the gate stack, wherein the top surface of the second metal-containing element is lower than a top surface of the spacer, wherein the spacer includes a first spacer element adjacent to the sidewalls of the gate stack and a second spacer element adjacent to the first spacer element, wherein the second spacer element is in direct contact with a lower portion of the second metal contact feature.

10. The semiconductor structure as claimed in claim 9, wherein the second spacer element is made of a material different from that of the first spacer element.

11. The semiconductor structure as claimed in claim 9, wherein the second spacer element is in direct contact with the metal-semiconductor compound layer.

12. The semiconductor structure as claimed in claim 9, further comprising:
a dielectric layer surrounding the first metal contact feature and the second metal contact feature over the epitaxial structure and the gate stack, wherein the first metal contact feature is separated from the second metal contact feature by the dielectric layer.

13. The semiconductor structure as claimed in claim 9, wherein materials of the first metal-containing element and the first metal contact feature are different.

14. A semiconductor structure, comprising:
a source/drain structure over a semiconductor substrate;
a gate stack adjacent to the source/drain structure over the semiconductor substrate;
a metal-semiconductor compound layer on the source/drain structure;
a first metal-containing portion on a metal layer of the gate stack;
a second metal-containing portion on the metal-semiconductor compound layer;
a first metal-containing element on the first metal-containing portion;
a second metal-containing element on the second metal-containing portion;
a first metal contact feature on the first metal-containing element;
a second metal contact feature on the second metal-containing element; and
a spacer in direct contact with a sidewall of the second metal-containing element and a sidewall of the second metal contact feature, wherein a sidewall of the second metal-containing portion and a sidewall of the metal-semiconductor compound layer are contacted by the spacer.

15. The semiconductor structure as claimed in claim 14, wherein an interface between the first metal-containing element and the first metal-containing portion is lower than a top surface of a gate dielectric layer of the gate stack.

16. The semiconductor structure as claimed in claim 14, wherein an interface between the first metal-containing element and the first metal-containing portion is higher than the interface between the second metal-containing element and the second metal-containing portion.

17. The semiconductor structure as claimed in claim 14, wherein a top surface of the second metal-containing element is lower than the top surface of the spacer.

18. The semiconductor structure as claimed in claim 14, wherein a bottom surface of the second metal-containing portion is higher than a bottom surface of the spacer.

19. The semiconductor structure as claimed in claim 14, wherein a top surface of the second metal-containing portion is higher than a bottom surface of the spacer.

20. The semiconductor structure as claimed in claim 14, wherein a bottom surface of the metal-semiconductor compound layer is higher than a bottom surface of the spacer.

* * * * *